United States Patent
Dhurandhar et al.

(10) Patent No.: US 9,600,773 B2
(45) Date of Patent: *Mar. 21, 2017

(54) DETECTING ELECTRICITY THEFT VIA METER TAMPERING USING STATISTICAL METHODS

(71) Applicant: International Business Machines Corporation, Armonk, NY (US)

(72) Inventors: Amit Dhurandhar, Yorktown Heights, NY (US); Jayant R. Kalagnanam, Tarrytown, NY (US); Stuart A. Siegel, Milburn, NJ (US); Yada Zhu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 750 days.

This patent is subject to a terminal disclaimer.

(21) Appl. No.: 14/026,695

(22) Filed: Sep. 13, 2013

(65) Prior Publication Data

US 2014/0358839 A1  Dec. 4, 2014

Related U.S. Application Data

(63) Continuation of application No. 13/909,239, filed on Jun. 4, 2013.

(51) Int. Cl.
*G06F 17/50* (2006.01)
*G06N 5/04* (2006.01)
(Continued)

(52) U.S. Cl.
CPC ............... *G06N 5/04* (2013.01); *G01D 4/00* (2013.01); *G06N 99/005* (2013.01); *G06Q 50/06* (2013.01);
(Continued)

(58) Field of Classification Search
CPC ........ G06Q 50/06; G06Q 10/00; G06Q 40/08; G06Q 10/04; G06Q 10/06; G06Q 10/0635;
(Continued)

(56) References Cited

U.S. PATENT DOCUMENTS 6,801,865 B2   10/2004   Gilgenbach et al.
7,606,537 B2 *  10/2009   Brodhead ............... H04L 27/02
                                                            455/106

(Continued)

OTHER PUBLICATIONS

Hampapur_2011 (Analytics-driven asset management, IBM J. Res. & Dev. vol. 55 No. 1&2 Paper 13 Jan./Mar. 2011).*

(Continued)

*Primary Examiner* — Kamini S Shah
*Assistant Examiner* — Scott S Cook
(74) *Attorney, Agent, or Firm* — Scully, Scott, Murphy & Presser, P.C.; Daniel P. Morris, Esq.

(57) ABSTRACT

A method for detecting anomalous energy usage of building or household entities. The method applies a number of successively stringent anomaly detection techniques to isolate households that are highly suspect for having engaged in electricity theft via meter tampering. The system utilizes historical time series data of electricity usage, weather, and household characteristics (e.g., size, age, value) and provides a list of households that are worthy of a formal theft investigation. Generally, raw utility usage data, weather history data, and household characteristics are cleansed, and loaded into an analytics data mart. The data mart feeds four classes of anomaly detection algorithms developed, with each analytic producing a set of households suspected of having engaged in electricity theft. The system allows a user to select households from each list or a set based on the intersection of all individual sets.

13 Claims, 16 Drawing Sheets

(51) Int. Cl.
G01D 4/00 (2006.01)
G06N 99/00 (2010.01)
G06Q 50/06 (2012.01)
G08B 21/18 (2006.01)
G01R 22/06 (2006.01)

(52) U.S. Cl.
CPC ............ *G08B 21/18* (2013.01); *G01R 22/066* (2013.01); *Y04S 20/36* (2013.01)

(58) Field of Classification Search
CPC .. G06Q 10/06375; G06Q 10/10; G06Q 20/04; G06Q 20/40; G06Q 20/4016; G06Q 30/0201; G06Q 30/0214; G06Q 30/0234; G06N 5/04
USPC .......................................................... 703/6
See application file for complete search history.

(56) References Cited

U.S. PATENT DOCUMENTS

| | | | |
|---|---|---|---|
| 7,813,944 B1* | 10/2010 | Luk .................. | G06Q 40/08 705/2 |
| 2002/0004735 A1* | 1/2002 | Gross ................ | G06Q 30/0214 705/26.41 |
| 2005/0086090 A1* | 4/2005 | Abrahams .......... | G06Q 10/0635 705/7.28 |
| 2007/0129893 A1* | 6/2007 | McColl .............. | G06Q 10/00 702/19 |
| 2007/0247331 A1 | 10/2007 | Angelis et al. | |
| 2007/0247789 A1* | 10/2007 | Benson .............. | G01D 4/006 361/672 |
| 2010/0007336 A1 | 1/2010 | de Buda | |
| 2010/0293090 A1* | 11/2010 | Domenikos ........ | G06Q 10/04 705/38 |
| 2011/0178937 A1* | 7/2011 | Bowman ............ | G06Q 10/00 705/314 |
| 2012/0232915 A1* | 9/2012 | Bromberger ....... | G01D 4/004 705/1.1 |
| 2013/0259300 A1* | 10/2013 | Rosswog ........... | G06N 5/04 382/103 |
| 2014/0058763 A1* | 2/2014 | Zizzamia .......... | G06Q 40/08 705/4 |
| 2014/0280208 A1* | 9/2014 | McConky .......... | G06F 17/3053 707/748 |
| 2015/0067325 A1* | 3/2015 | Harris ............... | G06F 21/6218 713/165 |

OTHER PUBLICATIONS

Nizar_2006 (Load Profiling Method in Detecting non-technical Loss Activities in a Power Utility, First International Power and Energy Coference PECon Nov. 28-29, 2006, Putrajaya, Malaysia).*

Jenks_2010 (Dimensions of the Sustainable City 2, Springer 2010).*
Eng_Stat_2012 (Engineering Statistics: Handbook, NIST/SEMATECH e-Handbook of Statistical Methods, http://www.itl.nist.gov/div898/handbook/, Apr. 2012).*
Monedero, I., MIDAS: Detection of Non-technical Losses in Electrical Consumption Using Neural Networks and Statistical Techniques, ICCSA 2006, LNCS 3984, pp. 725-734.*
Mondedero, I., Using Regression Analysis to Identify Patterns of Non-technical Losses on Power Utilities, KES 2010, Part I, LNAI 6276, pp. 410-419, 2010.*
Bachvarov, A., Utility Company Consumers Consumption Patterns reltated to Illegal Customer Behavior (Thefts), International Conference on Application of Information and Communication Technology and Statistics in Economy and Education (ICAICTSEE—2010), Oct. 5-6, 2012, UNWE, Sofia, Bulgaria.*
ASA_2013, How Do I Become a Statistician, May 2013, downloaded from http://web.archive.org/web/20130306230905/http://www.amstat.org/careers/howdoibecom . . . .*
Soto, J.: Statistical testing of random number generators. In: Proceedings of the 22nd National Information Systems Security Conference, Crystal City, Virginia (1999).*
Mohammed, M.A., Testing Randomness in Ciphertext of Block-Ciphers Using HieHard, IJCSNS International Journal of Computer Science and Network Security, vol. 10 No. 4, Apr. 2010.*
Bradley, J.V., Distribution-Free Statistical Tests, Prentice-Hall, 1968.*
Christensen, H.B., Introduction to Statistics: A calculus-based approach, Harcourt Brace Jovanovich, Inc. 1992.*
Confused_2011, Your Energy Usage Group, Aug. 28, 2011, downloaded from https:/tweb.arclive.orglweb/20110828051623/trttp:/lwww .confused.com/gas-electricity/glideslycu -energy-usage-gr01.4>.*
Tarpey, T., A Parametric K-means Algorithm, Comput Stat. Apr. 2007; 22 (1): 71-89.*
Sanchez, I.B., Clients Segmentation According to their Domestic Energy Consumption by the Use of Self-Organizing Maps, Feb. 25, 2009.*
Abreu, J.M., Using Pattern Recognition to Identify Habitual Behavior in Residential Electricity Consumption, Energy and Buildings 49 (2012) 479-487.*
Bolton_2002 (Statistical Fraud Detection: A Review, Statistical Science 2002, vol. 17. 3, 235-255).*
Wickham_2011 (The split-apply-combine strategy for data analysis, Journal of Statistical Software, Apr. 2011, vol. 40, Issue 1.*
"1.2.5.13.Runs Test for Detecting Non-randomness," www.itl.nist.gov/div898/handbook/eda/section3/eda35d.htm, last printed May 8, 2013, pp. 1-3.
"The SPSS TwoStep Cluster Component," SPSS, Inc., http://www.spss.ch/upload/1122644952_The%20SPSS%20TwoStep%20Cluster%20Component.pdf, White paper, technical report, Jul. 2012, pp. 1-9.

\* cited by examiner

| PREMISEID | SHIFT_1_CLUSTERS | SHIFT_2_CLUSTERS | SHIFT_3_CLUSTERS |
|---|---|---|---|
| -2129495941 | CLUSTER-1 | CLUSTER-1 | CLUSTER-2 |
| 190307821 | CLUSTER-1 | CLUSTER-1 | CLUSTER-2 |
| -905286295 | CLUSTER-1 | CLUSTER-1 | CLUSTER-2 |
| -761719719 | CLUSTER-1 | CLUSTER-1 | CLUSTER-2 |
| -769744935 | CLUSTER-1 | CLUSTER-1 | CLUSTER-2 |
| -945267321 | CLUSTER-1 | CLUSTER-1 | CLUSTER-2 |
| -1106047787 | CLUSTER-1 | CLUSTER-1 | CLUSTER-2 |
| -1958168372 | CLUSTER-1 | CLUSTER-1 | CLUSTER-2 |
| -2005286817 | CLUSTER-1 | CLUSTER-1 | CLUSTER-2 |
| 1883856654 | CLUSTER-1 | CLUSTER-1 | CLUSTER-3 |
| 1477249615 | CLUSTER-1 | CLUSTER-1 | CLUSTER-3 |
| 1261373518 | CLUSTER-1 | CLUSTER-1 | CLUSTER-3 |
| 1587137040 | CLUSTER-1 | CLUSTER-1 | CLUSTER-3 |
| 1533408879 | CLUSTER-1 | CLUSTER-1 | CLUSTER-3 |
| 971101985 | CLUSTER-1 | CLUSTER-1 | CLUSTER-3 |
| 756534270 | CLUSTER-1 | CLUSTER-2 | CLUSTER-3 |
| 1404858750 | CLUSTER-1 | CLUSTER-1 | CLUSTER-1 |
| 763416402 | CLUSTER-2 | CLUSTER-1 | CLUSTER-1 |
| 758746228 | CLUSTER-2 | CLUSTER-1 | CLUSTER-1 |
| 393128294 | CLUSTER-2 | CLUSTER-1 | CLUSTER-1 |
| 1195528899 | CLUSTER-2 | CLUSTER-1 | CLUSTER-3 |
| 1530484732 | CLUSTER-2 | CLUSTER-1 | CLUSTER-3 |
| 573150737 | CLUSTER-2 | CLUSTER-1 | CLUSTER-3 |
| 1282825855 | CLUSTER-2 | CLUSTER-1 | CLUSTER-3 |
| 1989410115 | CLUSTER-2 | CLUSTER-1 | CLUSTER-3 |

FIG. 5

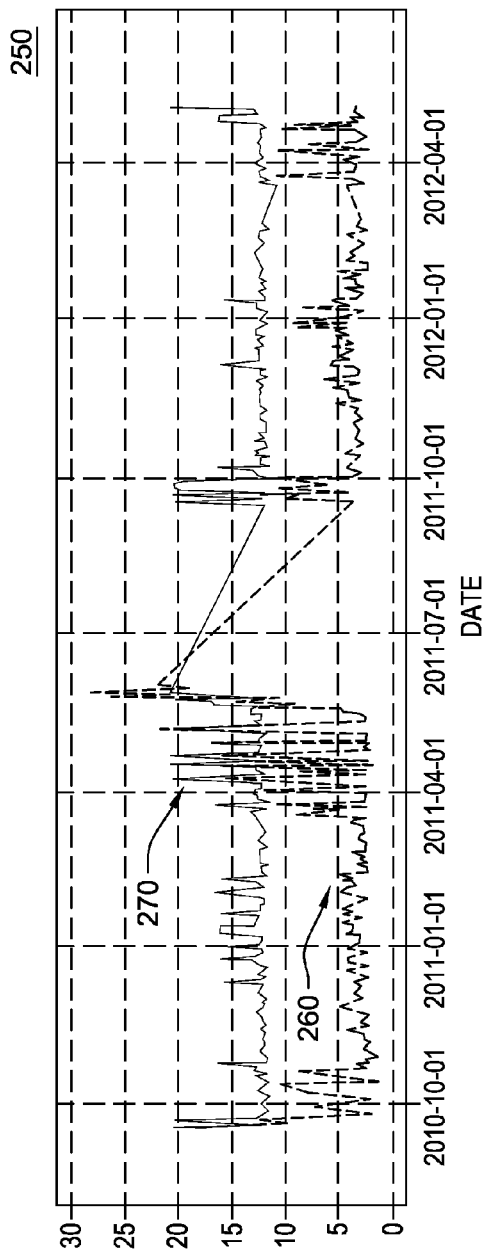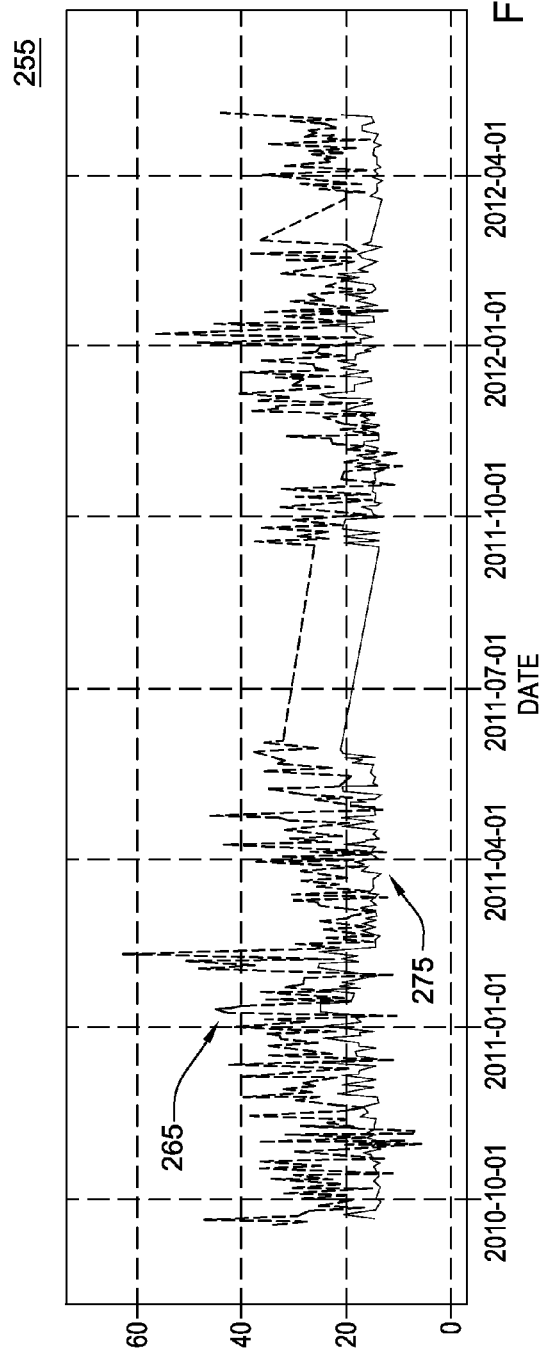

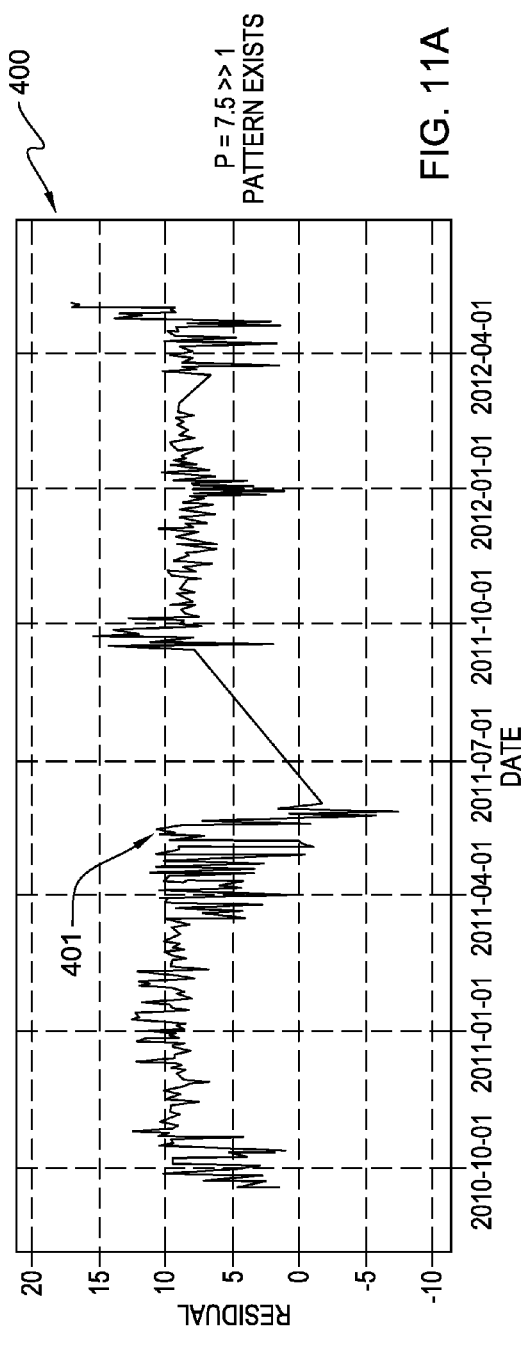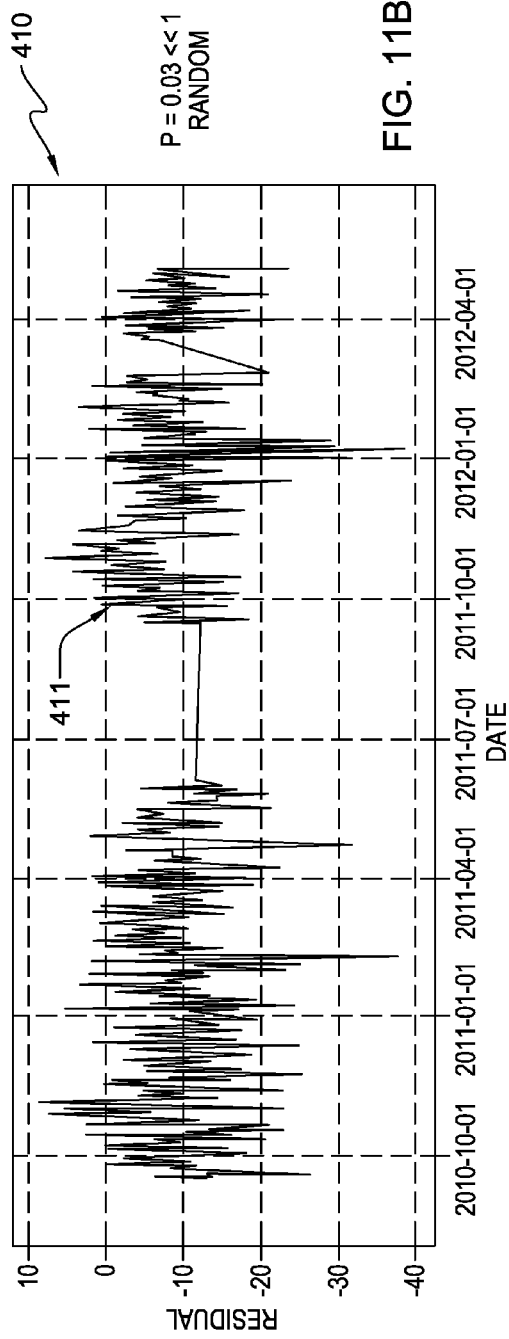

DETECTING ELECTRICITY THEFT VIA METER TAMPERING USING STATISTICAL METHODS

CROSS REFERENCE TO RELATED APPLICATION

This application is a continuation of U.S. patent application Ser. No. 13/909,239, filed Jun. 4, 2013 the entire contents and disclosure of which is incorporated herein by reference.

FIELD OF INVENTION

The present disclosure relates to techniques for detecting electricity theft; more particularly, disclosure relates to a system and method to detect electricity theft via meter tampering using statistical method of anomaly detection.

BACKGROUND

An electric meter is used to assist electric utility companies to monitor electrical energy usage at a respective household or place of business. Electricity tampering is a phenomena conducted by unscrupulous people to obtain free electricity use by compromising the electricity meter typically installed at household residences and businesses to alter their recorded energy consumed. Theft of electricity via meter tampering is a large problem ($1 B-10 B in lost revenue).

Utilities that have installed smart meters would like to leverage their investment by reducing this loss. Today, common methods include visual inspection of usage and ad-hoc auditing, i.e., manual processes to perform ad-hoc analysis of meter usage data. False positives are embarrassing and can damage customer relationships.

There currently does not exist any method of system to help an electric utility detect electricity theft. What few techniques are available are not coordinated with the electric utility company, nor are existing techniques effective in any sense to detect and/or isolate a single household's converting of electrical energy via meter tampering.

That is, many supervised learning techniques exist but these suffer from the need to have labeled theft data which is very hard to obtain. A system and method that addresses the need to perform such an analysis using unsupervised methods with unsupervised data would be highly desirable.

SUMMARY

There is provided a system and methodology for detecting and/or isolate a single household's converting of electrical energy using unsupervised methods such as via meter tampering.

In one embodiment, the system and methodology for detecting and/or isolate a single household's converting of electrical energy includes analyzing customer usage data, household characteristics, and weather data by flagging anomalously low energy consumption.

Generally, in one embodiment, the method applies a number of successively stringent anomaly detection techniques to isolate households that are highly suspect for having engaged in electricity theft via meter tampering. The system and methods employ adaptive statistical methods for detecting anomalous energy usage at the household level.

In one embodiment, the system utilizes historical time series data of electricity usage, weather, and household characteristics (size, age, value) and provides a list of households that are worthy of a formal theft investigation.

In one embodiment, there is provided a computer-implemented method for detecting anomalous energy usage amongst building and household entities. The method comprises: receiving, at a computing system, data comprising energy usage data relating to a building's actual energy use over a defined time period, characteristics data of the building, and weather data over one or more defined time periods; clustering buildings in one or more clusters as determined based on a building's energy usage in each time period; identifying buildings having energy usage that migrate from one cluster to another cluster between time periods, generating a model to predict a building's energy usage, the model defining expected bounds of energy consumption given time of day (shift) and weather and building characteristics data received; comparing energy usage for each building against an energy use predicted by the model for the building; and identifying, from the comparison, buildings whose electricity usage is not predicted by model; wherein the buildings identified as migrating from one cluster to another cluster between time periods, and the buildings exhibiting electricity usage not predicted by the generated model are flagged as anomalous energy usage entities, wherein a processing unit of the computer system is configured to perform the receiving, clustering, identifying of migrating buildings, model generating, comparing, and the identifying of buildings from the comparison.

In a further aspect, there is provided a system for detecting anomalous energy usage amongst building and household entities. The system comprises: a data storage device; a processor unit coupled to the data storage device configured to perform a method to: receive, at a computing system, data comprising energy usage data relating to a building's actual energy use over a defined time period, characteristics data of the building, and weather data over one or more defined time periods; cluster buildings in one or more clusters as determined based on a building's energy usage in each time period; identify buildings having energy usage that migrate from one cluster to another cluster between time periods, generate a model to predict a building's energy usage, the model defining expected bounds of energy consumption given time of day (shift) and weather and building characteristics data received; compare energy usage for each building against an energy use predicted by the model for the building; and identify, from the comparison, buildings whose electricity usage is not predicted by model, wherein the buildings identified as migrating from one cluster to another cluster between time periods, and the buildings exhibiting electricity usage not predicted by the generated model are flagged as anomalous energy usage entities.

In accordance with a further aspect, there is provided a computer-implemented method for detecting anomalous energy usage amongst building and household entities, the method comprising: receiving, at a computing system, data comprising energy usage data relating to a building's actual energy use over a defined time period, characteristics data of the building, and weather data over one or more defined time periods; running a first anomaly energy use detection scheme to cluster buildings in one or more clusters as determined based on a building's energy usage in each time period and identify buildings having energy usage that migrate from one cluster to another cluster between time periods; running a second anomaly energy use detection scheme to generate a non-linear regression model to predict a building's energy usage, the model defining expected bounds of energy consumption given time of day (shift) and weather and building characteristics data received, and identifying buildings whose electricity usage is not predicted by model; and running a third anomaly energy use detection scheme to obtain from the generated non-linear regression model, a pattern of residuals of the generated model over time, a residual representing a difference between the energy actual and predicted energy use for a building, and identifying buildings demonstrating non-randomness of its obtained pattern of residuals; and running a fourth anomaly energy use detection scheme to estimate a sigma and theft likelihood field {Ln,t} of each building and each day, and obtaining a theft likelihood field for all the shifts; and, invoke a rule applied to the theft likelihood field; and flagging anomalous energy usage buildings as buildings identified as: having energy usage that migrate from one cluster to another cluster between time periods; having electricity usage not predicted by the model; exhibiting demonstrating non-randomness of its obtained pattern of residuals; or have a residual energy computed for a building as exceeding a certain distance from an expected residual mean based on the rule; or combinations thereof.

A computer program product is provided for performing operations. The computer program product includes a storage medium readable by a processing circuit and storing instructions run by the processing circuit for running a method(s). The method(s) is(are) the same as listed above.

BRIEF DESCRIPTION OF THE DRAWINGS

The present invention will be described with reference to FIGS. 1-14. When referring to the figures, like elements shown throughout are indicated with like reference numerals.

FIG. 5 shows an example results list 66 of usage cluster migrations generated by the analytics software;

FIG. 8A shows an example usage plot 250 of most anomalous premises including the actual usage and expected usage plots over a time period;

FIG. 8B displays an example usage plot of a normal usage for the building as represented in the building of FIG. 8A;

FIG. 11A depicts example usage plots of residuals (y-axis) over time (x-axis) including residuals exhibiting a pattern of anomalous usage, and FIG. 11B depicts usages indicating the residual computed for a normal building;

DETAILED DESCRIPTION

The present system and methods address a number of challenges when detecting non-technical losses at the household level using Automated Metering System (AMS) meter data. These include: the managing of typically high AMS data volumes that are often not warehoused in a way that readily support analytics; the development and use of analytics that have low false-positive rates so that utility revenue assurance teams can better allocate their revenue protection investigative and enforcement resources; and identifying, obtaining, and cleansing additional (possibly third party) data such as weather and household and demographic characteristics. These data are critical for building better analytical models of household energy use.

Figure 1A:
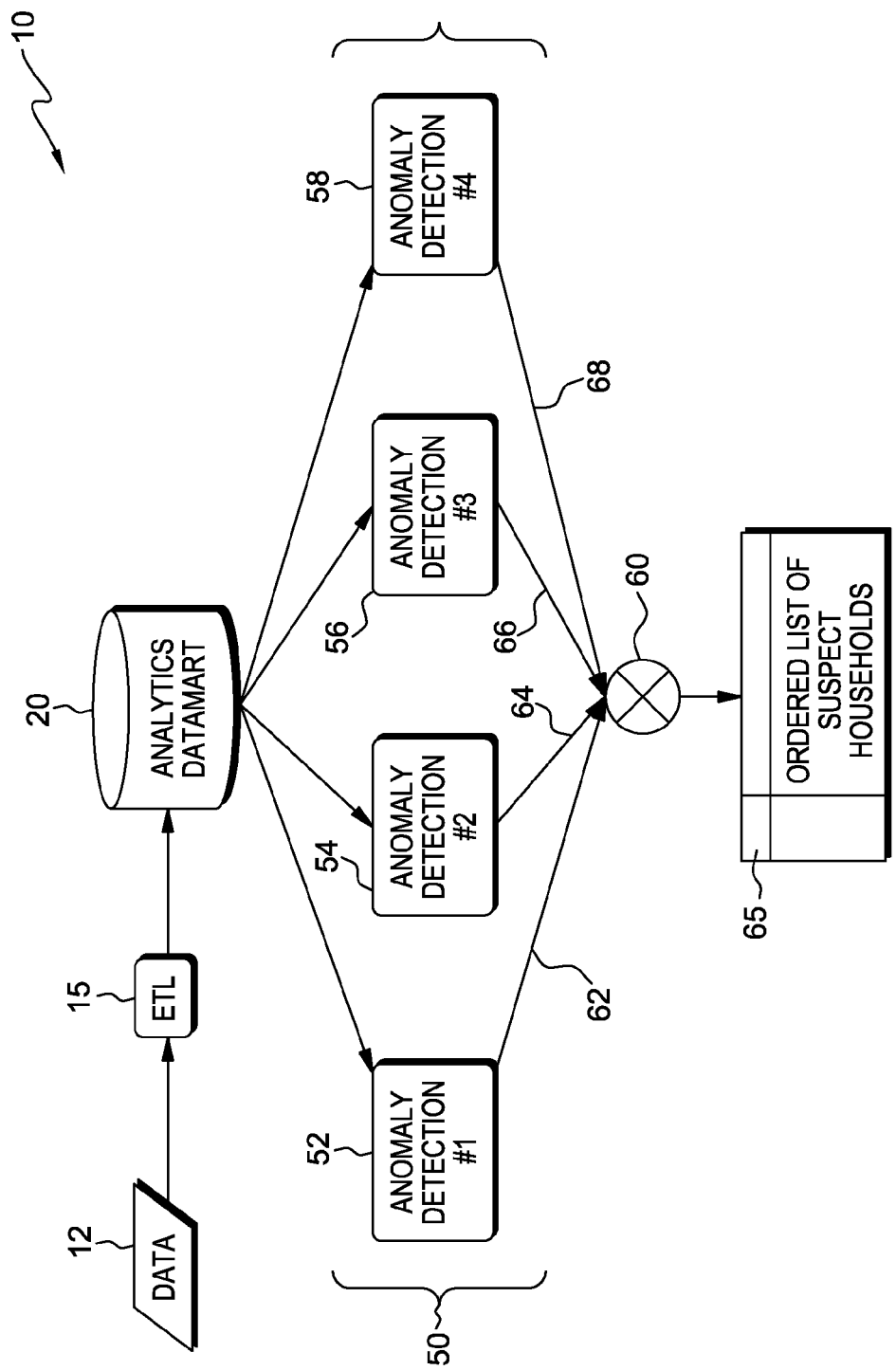
FIG. 1A shows a basic system infrastructure for detecting electricity theft via meter tampering according to one embodiment.

As shown in FIG. 1A, the basic system infrastructure 10 to detect electricity theft via meter tampering using statistical methods is as follows: 1) data 12, such as Raw utility usage data, weather history data, and household characteristics data, are subject to extraction, transformation and loading (ETL) processing 15 for cleansing, and eventual loading into an analytics data mart 20; 2). The data mart 20 feeds data to a number of classes, e.g., four classes, of anomaly detection algorithms 50 that the system employs. As shown in FIG. 1A, the system applies a number of customized anomaly detection techniques 52, 54, 56 and 58 to isolate households that are highly suspect for having engaged in electricity theft via meter tampering. 3). Each analytic, e.g., 52, 54, 56 and 58, produces a corresponding set of households 62, 64, 66 and 68 suspected of having engaged in electricity theft. 4). The system allows the user to select households from each list or a set 65 based on the intersection 60 of all individual sets.

As referred to herein, a "household" entity corresponds to a physical structure or premises having one or more units to which electrical energy is supplied and used by occupants, and a "building" entity also corresponds to a structure or premises having a plurality of office or dwelling units to which electrical energy is supplied and used by occupants. Household, premises and building entities are interchangeable in the description herein.

Figure 1B:
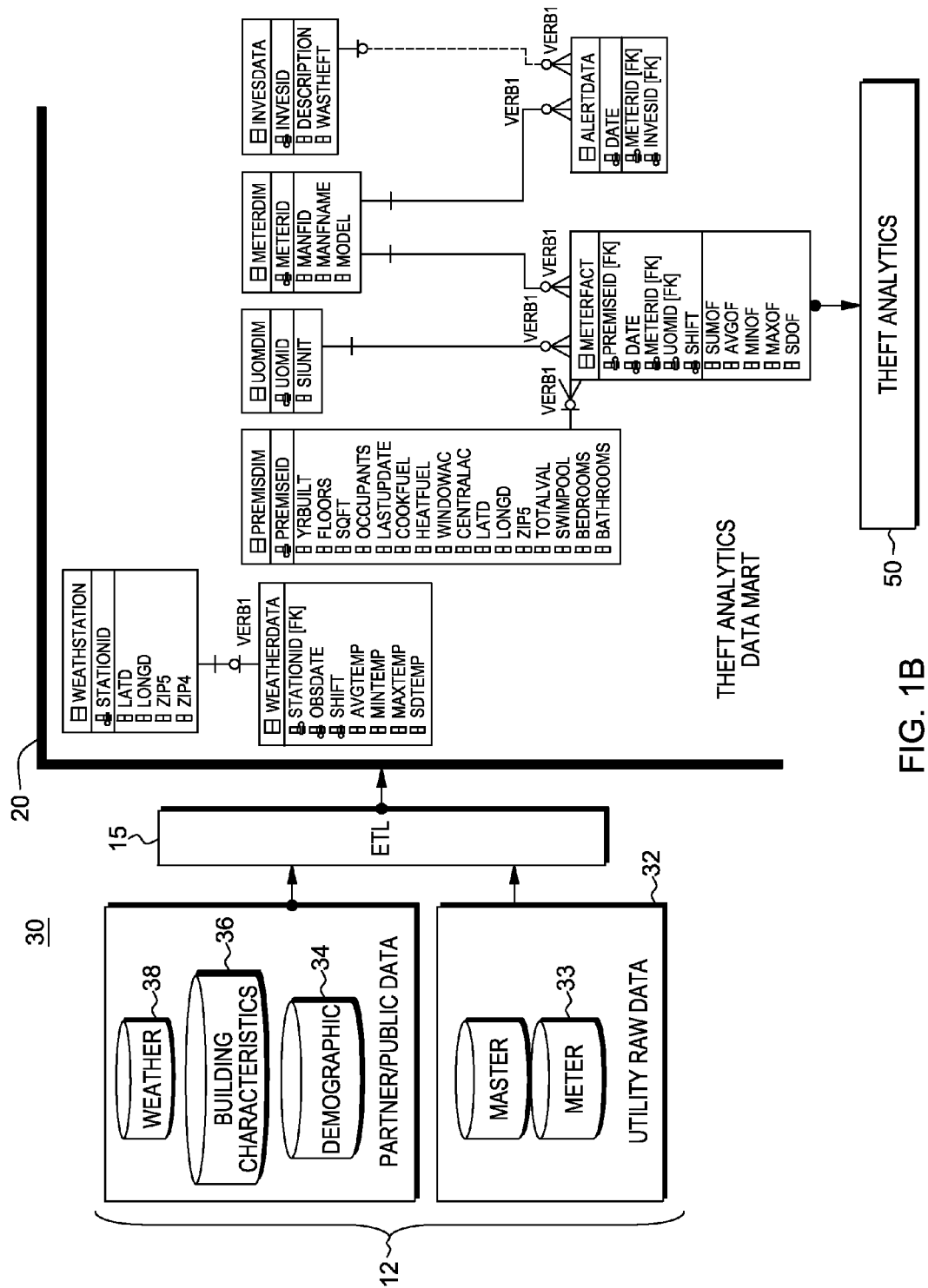
FIG. 1B illustrates an example high level view 30 of the data architecture of FIG. 1A including all data elements 12, ETL processing 15, and the meter theft analytics datamart design 20.

FIG. 1B illustrates an example high level view 30 of the data architecture of FIG. 1A including all data elements 12, ETL processing 15, and the meter theft analytics datamart design 20. As shown, the system 10 utilizes historical time series data of electricity usage 32, customer demographics 34 and household/building characteristics (size, age, value) data 36 and weather data 38. The datamart 20 is configured so that the relevant data features driving the theft analytics 52, 54, 56, 58 are isolated. This ensures that for future engagements with other utilities, the main task would be a relatively easy (from a resource availability point of view) one of implementing the suitable ETL jobs to move utility-specific data to the datamart for consumption by the analytics. The goal is to eliminate the need to alter the analytics to accommodate utility-specific data schemas.

In one embodiment, the datamart 20 supplies the data in a cleansed structured form for delivery to the analytics described. This ensures structuring of analytic solutions so that they are not tied to a particular customer. Therefore, the datamart 20 is an enabler of the novel analytics to be deployed in the system. In one embodiment, the datamart schema incorporates a star schema for maintaining information to be provided for the combination of statistical and heuristic techniques described herein.

In one embodiment, the analysis includes providing meter theft analytic tracks 52, 54, 56, 58 that automatically identify "suspicious" sets of households that are worthy of being further investigated by the utility's revenue protection department, and provide a list of households that should be considered suspect. The system assists an electric utility detect electricity theft by analyzing customer usage data, household characteristics, and weather data by flagging anomalously low energy consumption.

Figure 14:
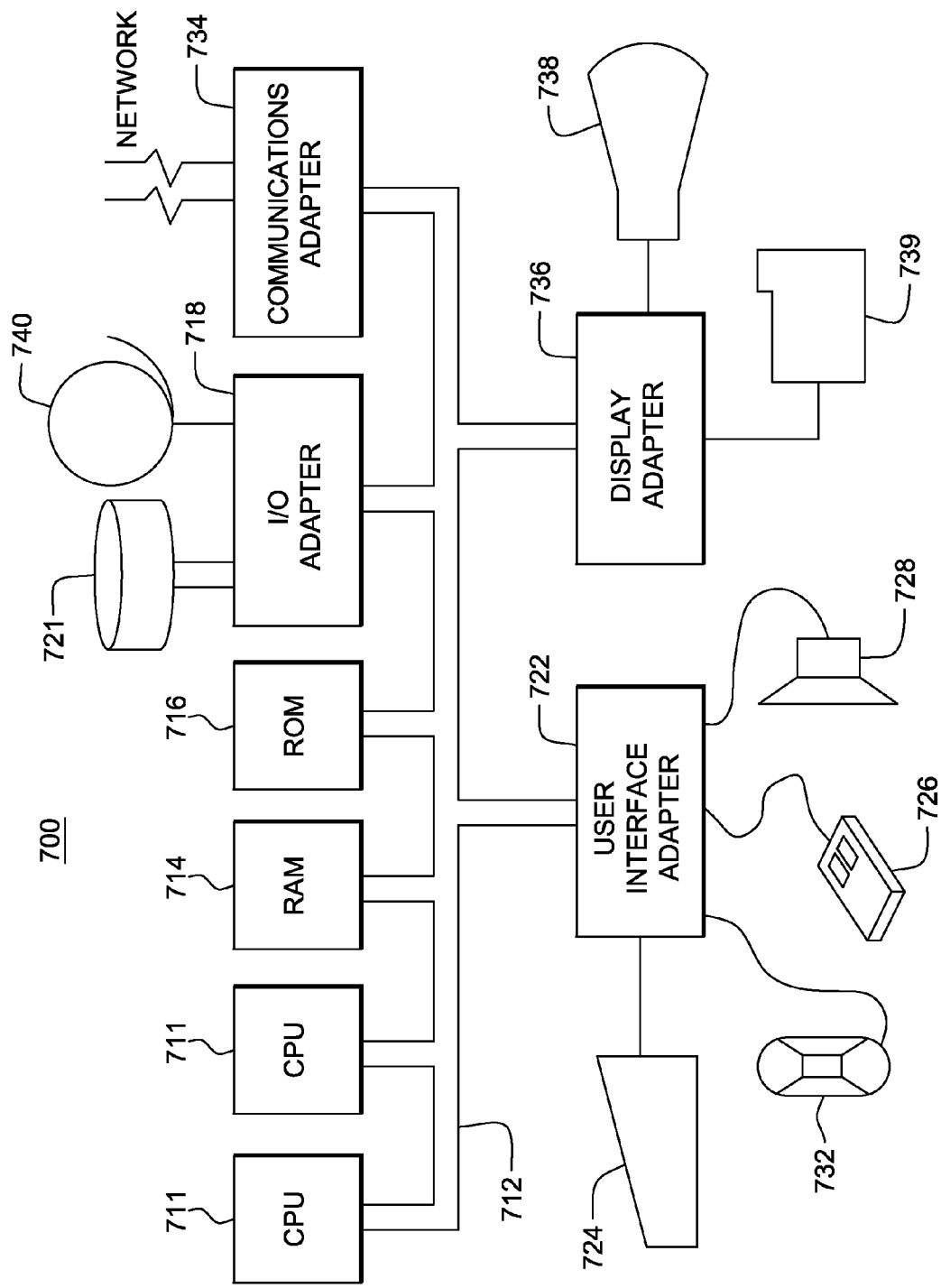
FIG. 14 illustrates an exemplary computing system configured for carrying out the methods to detect and/or isolate a single household's converting of electrical energy using unsupervised methods such as via meter tampering.

In one example embodiment, there is received or provided all data staging and analytic development activity on a computer system such as shown in FIG. 14 described in greater detail herein below. In one embodiment, metered usage data 33 of all households in a utility's service area is being analyzed.

As a means of managing data volumes without sacrificing the quality of the developed analytics, meter usage data 33 may be aggregated daily, e.g., 15-minute time interval or "shift", or aggregated data at an 8-hour shift. There may be three eight-hour shifts, for example, on input from the utility. As a reasonable assumption that theft patterns tend to follow customers' work schedules (i.e., customers remove meter tamper devices during normal business hours when they are not at home), then example shifts may be defined as an 8-hour block of time during the day: Shift 1 may corresponded to 00:00-07:59:59 hours, shift 2: 08:00-15:59:59 hours, and shift 3: 16:00-23:59:59 hours.

In addition to utility provided meter usage data 33, there is input to the system weather data 38, e.g., which may be provided as 5-minute interval reads of temperature and other features from monitoring stations within the utility's service area. This data may further be aggregated to the 3-daily shift level by postal code.

The system and method described herein are automatically invoked to identify anomalous buildings relative to problems that arise from meter tampering/electricity theft that: through a novel migration algorithm, identifies houses that change their behavior relative to other houses across times of the day; through generalization of Runs test used to test randomness of residuals, identifies houses with inexplicable electricity usage patterns after factoring out weather conditions and house characteristics; and through combination of rule-based and probability field methods, identifies houses that are occupied and exhibit suspiciously low electricity usage.

Since there are many different techniques for doing anomaly detection, one embodiment provides the utility revenue protection personal with a "menu" of activity tracks or "algorithmic kernels" that can be employed and arranged in customized flows for theft detection. Besides giving users the choice of which algorithmic kernel(s) (activity tracks) to employ for theft detection, each kernel ultimately draws some statistical or machine-learned inference about the data.

In a further embodiment, these techniques are used as an ensemble of filters applied to households to narrow down the set of suspicious ones; such techniques employing independent statistical and data analysis algorithms. The filter ensemble is the application of each of the analytics as a means of applying more rigorous criteria for flagging a household as 'suspicious' in an effort to reduce false positives. A method controlling ensemble filtering includes first identifying the set up of all suspicious households, Si, identified by analytic stream i, and implementing an ensemble technique to form the intersection of these sets to produce a new set of highly suspect households as they appear anomalous to all techniques.

A first algorithmic kernel identifies, in one example embodiment, buildings with anomalous usage patterns. In this first analytic track, the inputs to the computer system include daily shift usage data and weather data. Example whether data include, but are not limited to: temperature, peak temperature, temperature variance. Inputs further include building characteristics (e.g., size (e.g., square feet), floors, Number of occupants, age (year built), cooking fuel in use, heating fuel in use, a type of air conditioning (e.g., window air conditioners vs. central air conditioning), latitude of premise, longitude of premise, presence of a swimming pool, assessment value, number of bedrooms, number of bathrooms, last appraiser value, etc.). This track spots energy use cluster membership migrations from shift to shift.

The method includes first clustering households by usage in each shift. That is, for each of these shifts, the method assigns households to one of N clusters of homes determined based on their energy usage. The clustering is performed using the "2-step" using SPSS® (a registered trademark of Amos Development Corp.) analytics software provided K-means clustering method known in the art. For example, there are typically three clusters per shift: low usage households, medium usage, and high usage. The analytic identifies homes that migrate from one cluster to another between shifts.

The method leverages the fact that energy usage characteristics of households should follow regular patterns throughout the day (i.e., people going to work, coming home and turning on lights and air conditioners, etc.) If a home is placed in a cluster of 'large' energy consumers for morning and afternoon shifts, for example, it should remain there for the evening hours too since its large usage is likely an inherent characteristic of the home and its occupants. If it consistently migrates to a "small" usage cluster in the evening, for example, this is indicative of suspicious (electricity meter tampering) behavior.

Figure 2:
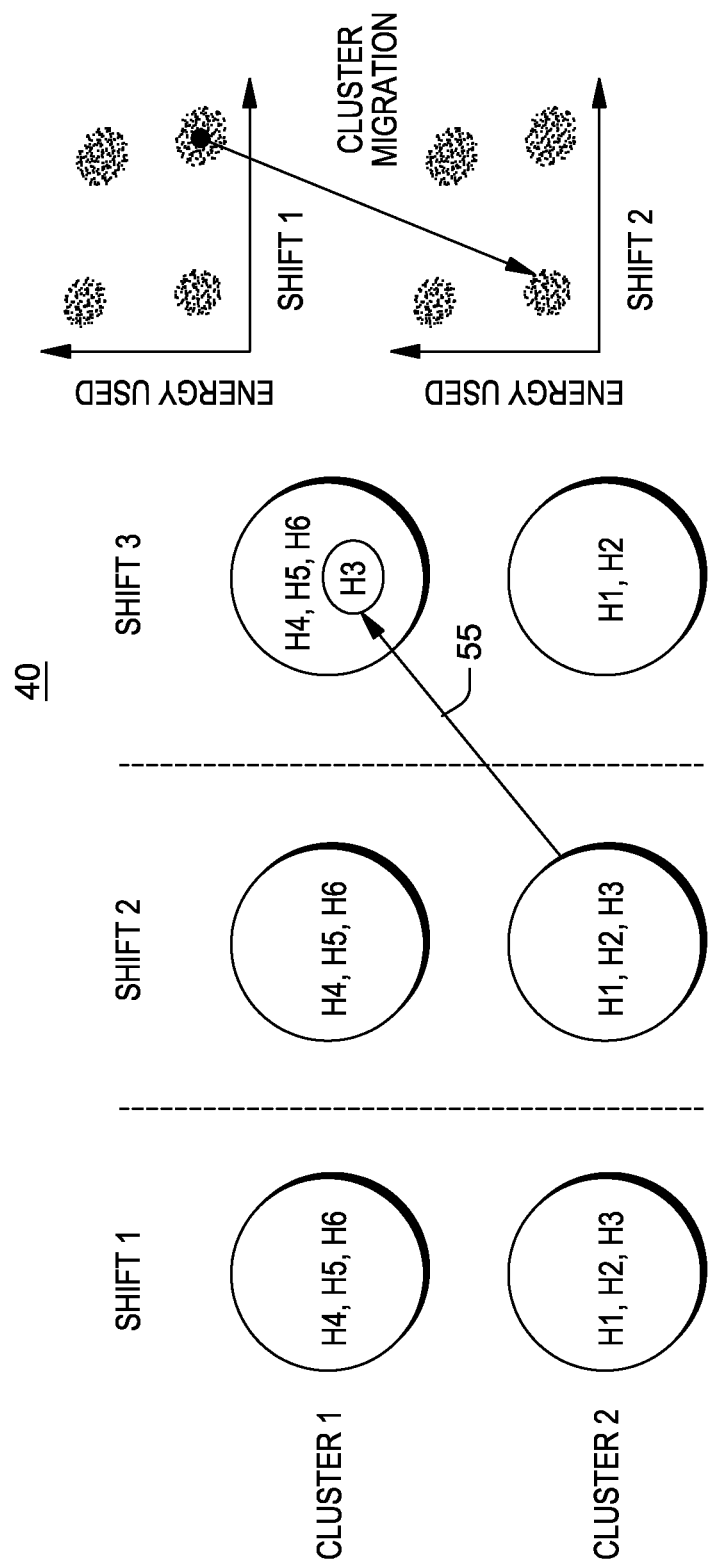
FIG. 2 shows results of a migration algorithm that looks for houses (buildings) that migrate between energy usage clusters as the shift (time of day) changes.

In one embodiment, a 2-step clustering algorithm is implemented that uses the energy used in each shift as the clustering dimension (or distance measure). As shown in an example clustering application in FIG. 2, two clusters of households, household Cluster 1 including households H4, H5, H6 and household Cluster 2 including households H1, H2, H3 are generated in each shift. The algorithm first identifies consistently different households/buildings for each shift; and for each shift, forms clusters based on usage and find households that migrate from one group to another across shifts. The migrating households are indicative of suspicious behaviour. More particularly, as shown in FIG. 2, a migration algorithm 40 looks for houses (Households (H1, H2, H3)) that migrate between these energy usage clusters as the shift (time of day) changes. This technique exploits the fact that if a house acts as high energy user in one shift (e.g., it's big, or maybe inefficient) then it should not be acting as a low energy user in a different shift (because nothing fundamentally has changed about the house in the time from one shift to the next.) In fact, the data show that most houses remain in their peer cluster throughout the day. A small percentage does not, however, as exemplified by household (H3) which is shown to be part of an initial Cluster 2 in shift 2, however has migrated 55 to Cluster 1 in shift 3. These identified migrating households are collected as an initial set of suspicious houses 65 as FIG. 1A illustrates.

Figure 3:
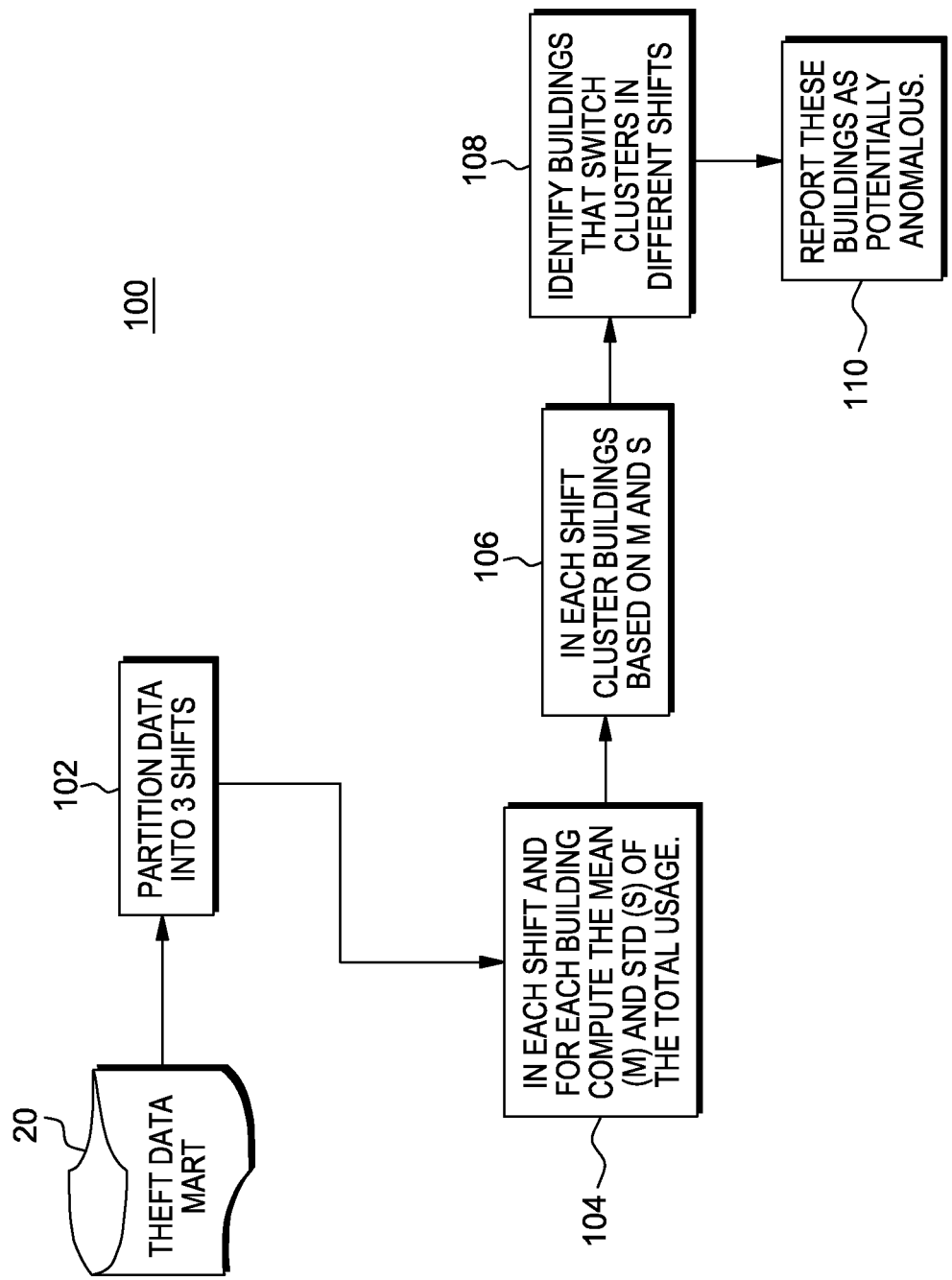
FIG. 3 shows a method 100 of detecting migrating energy usage entities according to one embodiment.

A "migration algorithm" shown in FIG. 3 is implemented for identifying houses that change based on usage the peer groups they belong to across times of day/shifts. FIG. 3 shows a general method 100 of detecting migrating energy usage entities in the context of the present disclosure. From the theft data mart 20, data processing techniques are invoked at 102 to partition the usage data into the number of usage shifts, e.g., three shifts. Then, at 104, in each shift, for each building and/or household, a mean (M) and standard deviation (std) is computed. Then, at 106, in each shift, there is performed clustering of the building/households based on the computed M and std. Then at 108, there is performed identifying any building or household that switch clusters in different shifts, which buildings or households or flagged and reported at 110 as potentially anomalous.

The example result of this analysis 40 as depicted in FIG. 2 shows that energy usage cluster migrations to low use clusters happen predominantly during the shift 2 to shift 3 time frame. This aligns very well with feedback from utility revenue protection personal about when people tamper with their meters (e.g., when they get home from work and want to turn on the air conditioning).

Figure 4A:
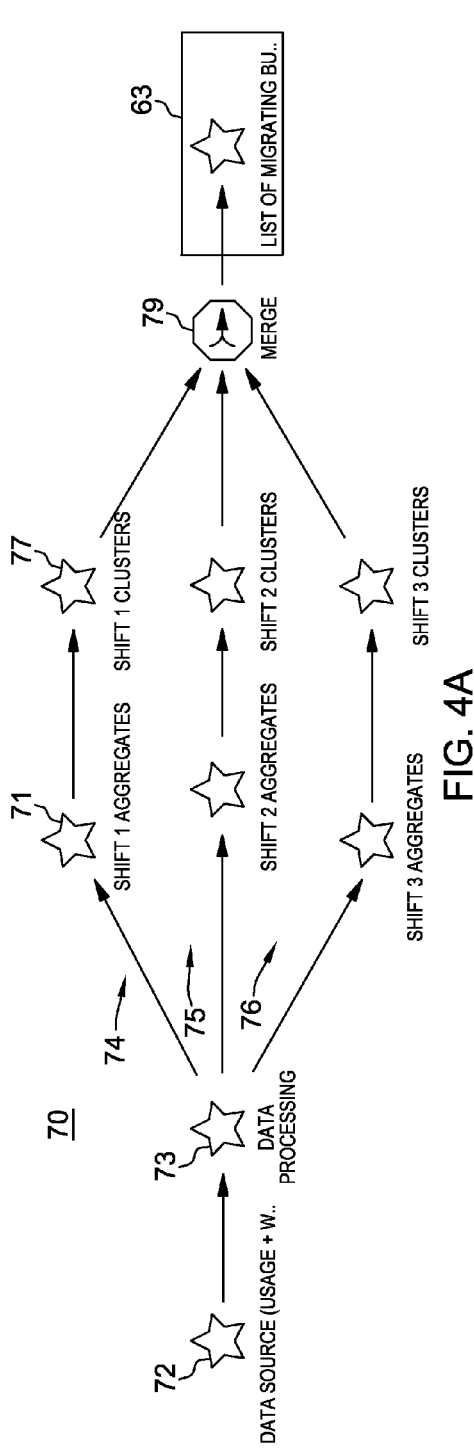
FIG. 4A depicts an implementation of the methods implemented using an analytics software package, and particularly an example SPSS® Modeler stream.

FIG. 4A depicts an implementation of this analytic track implemented using analytics software such as the SPSS®, and particularly an example SPSS® Modeler that link together various data manipulations and analytic operations to make an overall "stream" 70 representing a solution flow. As shown in FIG. 4A, a Modeler Stream 70 for determining migrating houses is depicted. The SPSS® modeller stream 70 includes interconnected (linked) nodes such as the usage data source 72 node from which a data processing node 73 obtains usage data. Then the method splits into parallel paths 74, 75 and 76 for processing according to shifts, with each parallel path including a series of one or more tasks represented as usage data aggregating supernode 71, and clustering operations represented as supernode 77 each supernode consisting of complex processing operations once expanded. For example, the 'complex' operations include a collection of common data processing operations like data reading, whitespace removal, etc. Any analytic software or combination of software supporting linear regression, 2-step clustering, CSV file reading, and string manipulation can be used. In one embodiment, the R programming language (part of the GNU project) and environment for statistical computing could be used to encode this algorithm, for example. The data aggregating and clustering operations performed at each task are then merged at 79 to obtain a final list 63 of detected household migrations.

FIG. 5 shows an example results list 63 of usage cluster migrations generated by the analytics software. This list indicates those premises detected as having energy use characteristics that "migrate" from one group (cluster) to another. The example list 63 shows the premises ID (corresponding to a household or building address) 67 and the corresponding entries 56a, 56b and 56c corresponding to each of usage cluster the building belongs at each respective time interval, e.g., shift 1, shift 2 and shift 3, as processed according to the algorithm of FIG. 3 to detect the migration. From the example results list, it is seen that migration detected mostly occurs in the $3^{rd}$ shift as shown by the example detections 57, with some in the $1^{st}$ shift.

A second algorithmic kernel identifies, in one example embodiment, buildings whose usage is persistently well below expected usage given the building characteristics and weather conditions. In this second analytic track, the method performs modeling energy usage with non-linear regression and flagging anomalies. This includes steps, for example, of identifying buildings whose electricity usage, after factoring out variations due to building characteristics and weather conditions, has a pattern that is inexplicable by the input variable such as temperature, home size, etc. This is done by creating a non-linear regression model of energy usage and comparing household usage to that predicted by the model. For each shift, the model "learns" over weather conditions and building characteristics to build the best fitting model.

That is, for each shift defined in the first analytic track, the system and method builds linear and non-linear regression models (see, e.g., Duda and Hart, *Pattern Recognition and Classification*, 2nd Ed, November 2000. where the best model(s) is(are) chosen based on goodness of fit metrics) for household energy usage. The model features (i.e., predictors) include weather measurements (temperature, rainfall, wind speed, etc.) and building characteristics (size, age, presence of central air conditioning, etc.). The models define what are expected bounds of energy consumption given time of day (shift) and weather inputs. Then, the households are sorted by the number of times that their household energy usage falls below the model-defined lower bounds. Thus, the method applies regression modeling for finding anomalies for use with large scale electric utility meter data and the implements a metric for ranking relative theft likelihood based on the number of excursions from expected values factoring in weather and other predictors.

Figure 6:
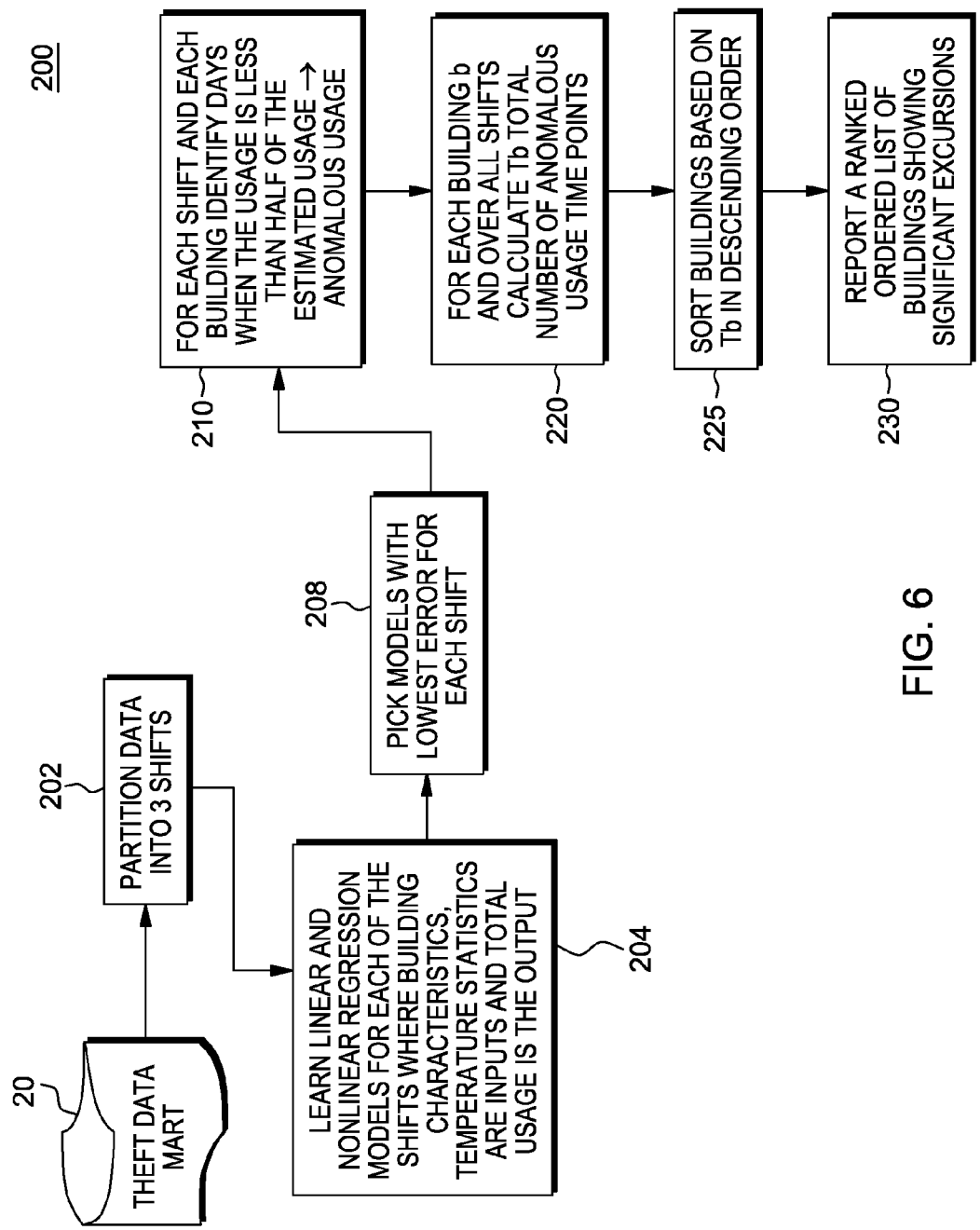
FIG. 6 shows a general method of detecting low energy usage by modeling an entity's energy usage with non-linear regressions.

FIG. 6 shows a general method 200 of detecting low energy usage by modeling an entity's energy usage with non-linear regressions. From the theft data mart 20, data processing techniques are invoked at 202 to partition the usage data into the number of usage shifts, e.g., three shifts. Then, at 204, there is built linear and non-linear regression models for each of the shifts where building characteristics, temperature statistics are inputs and total usage is the output. Then, at 208, the method performs selecting the model(s) with the lowest computed error for each shift. Continuing, at step 210, the method performs identifying, for each shift and each building/household, days when the usage is less than a predetermined amount of the estimated usage, e.g., less than 50% of the estimated usage. Such identified households or buildings are determined anomalous usage. Then, at 220, for each building "b" and over all shifts, the method performs calculating "Tb"—a total number of anomalous usage time points. Then, at 225, there is performed sorting the buildings/households based on Tb values in descending order. In one embodiment, as shown at 230, a ranked ordered list of buildings showing significant excursions may be generated.

Figure 7:
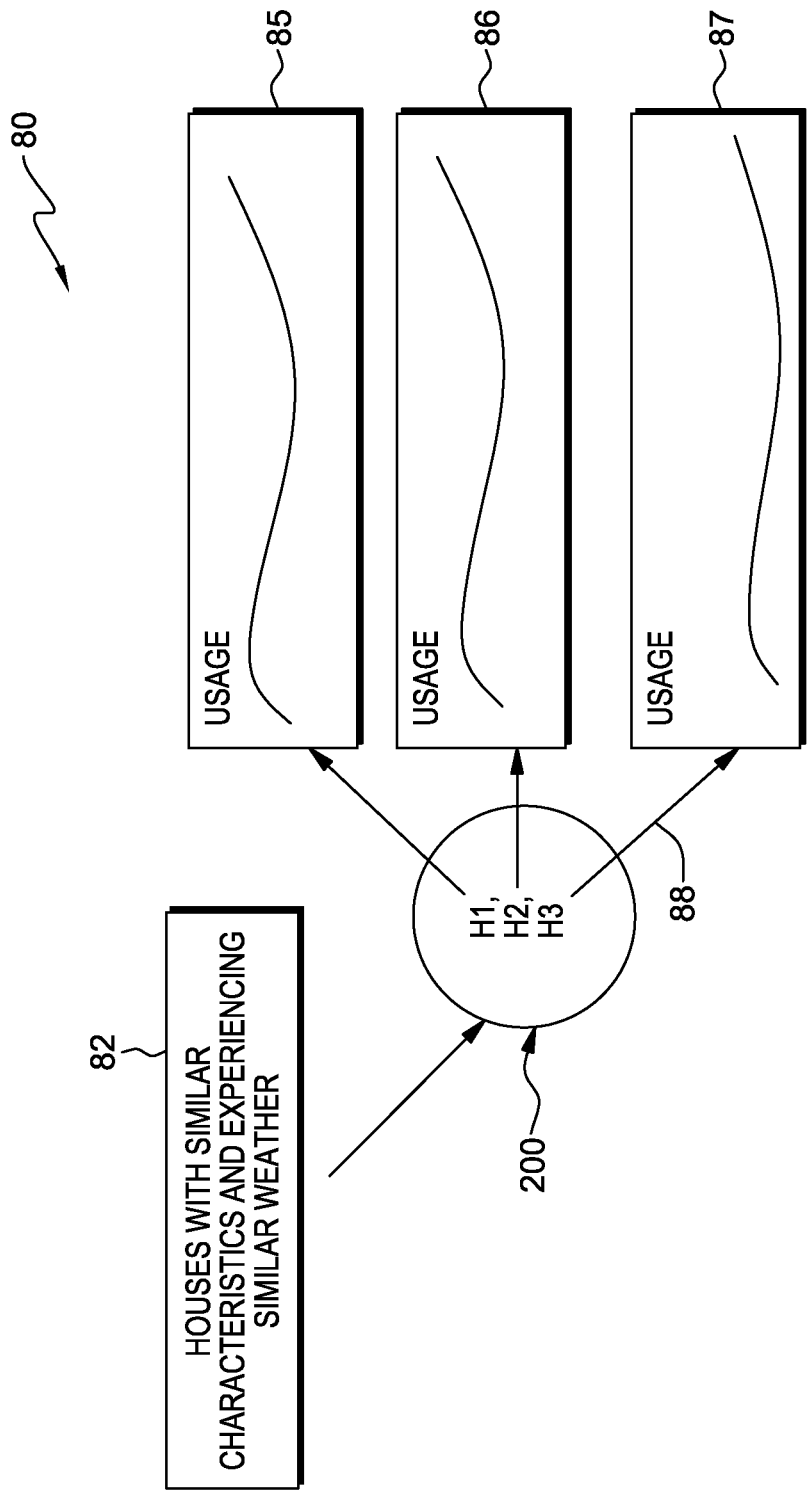
FIG. 7 shows an example of determining a household with a lower than expected usage using a non-linear regression model.

FIG. 7 shows an example method of determining a household with a lower than expected usage, where for each shift 80, a non-linear regression model is built that learns usage patterns over weather conditions and building characteristics. As indicated at 82, models are generated that result in usage patterns 85, 86, 87 generated for respective households H1, H2 and H3 having similar characteristics and experiencing similar weather. In comparing the example learned usages 85, 86, 87, there is identified household 87 whose usage is (persistently or) often significantly below expected and anomalous. Thus, the method at 88 includes identifying buildings whose usage is anomalous often significantly below expected.

Figure 4B:
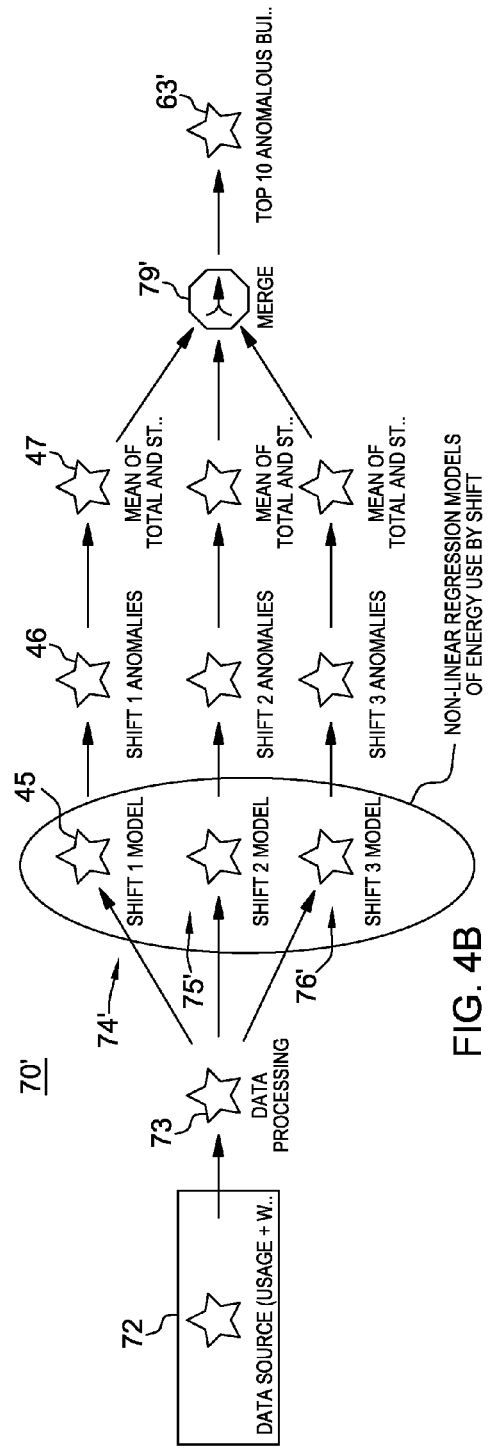
FIG. 4B shows the SPSS® Modeler stream 90 developed showing what differentiates a suspicious from normal household.

FIG. 4B shows the SPSS® Modeler stream of FIG. 4A developed to differentiates a suspicious from normal household and modified for determining low and persistently low usage buildings. In the example SPSS® Modeler Stream 70' of FIG. 4B, the modeller stream includes interconnected nodes such as the energy usage data source 72 node from which a data processing node 73 obtains usage data. Then the method splits processing into parallel paths 74', 75' and 76' which may run concurrently, for processing data usage according to the defined shifts (three for example), with each path including tasks with a first task for generating non-linear regression models of energy use (by shift) represented as supernode 46, and anomalous households detection operations based on the models represented as supernode 47 and other processing for obtaining totals, means and standard deviations and other statistical quantities used in detecting anomalous usage represented as supernode 48. For example, supernode 48 takes the mean, sum, and standard deviation of the number of times a household's usage is flagged as anomalous and uses this as a basis for ranking the most 'suspicious' households. The generated statistical quantities based on the computed non-linear regression models of energy used for anomalous households detection operations are performed at each task are then merged at 79' to obtain a final list 63' of detected household migrations.

It is understood that one can also use combinations of the above (and other) methods to obtain a smaller list and gain higher confidence that a given household is engaged in fraudulent activity.

FIG. 8A shows an example generated usage plot 250 of a most anomalous premises with the plot 260 being the actual usage and the plot 270 is the expected usage, e.g., for a shift, over a time period. Missing data is indicated at respective breaks in time in the plots.

FIG. 8B displays an example usage plot 255 of a normal building in the previous plot. The plot 265 is the actual usage and the plot 275 is the expected usage. These two plots together show that the actual usage is actual greater than expected and thus the premise is not a candidate for potential theft investigation.

A third algorithmic kernel tests, in one example embodiment, a Randomness of Residuals. This third analytic track extends the use of non-linear regression techniques used during the second analytic track (e.g., FIGS. 6, 7) by focusing on the pattern in the residuals of the model. In one embodiment, the method analyzes residual effects of usage after factoring out building characteristics and weather conditions by developing a customized randomization test. This kernel activity is used to spot apparent 'intelligent' behavior or 'gaming' in modeling residuals to flag possibly electricity theft.

A residual is defined as the difference in what a model (be it linear, or otherwise) predicts for the energy use of a house/building and what the energy use actually was as recorded by the meter, i.e., the difference in the actual and predicted energy use for a household. A random pattern(s) of residuals is expected in a statistical sense and is indicative that households are using energy in accordance with what would be 'expected' by the model. Residual patterns that demonstrate non-randomness (that is, display some sort of pattern) indicate that households are trying to 'game' the system by adjusting their energy usage to 'make it look normal'.

In this embodiment, the methods implemented determine if daily usage is randomized given that there is some amount of usage. This involves creating the non-linear regression models of energy usage, such as described herein with respect to FIGS. 6 and 7, and then analyzing the time variations in the model residuals. This analytic uses a novel variant of runs statistic techniques as described in Bradley, Distribution-Free Statistical Test 1968 in which this method is adapted for continuous data rather than just binary data and introduces asymmetry in the statistic so that residuals where lower than expected energy consumption is seen are flagged, thus detecting the degree of "non-randomness" in the residual pattern of energy use in households.

Figure 9:
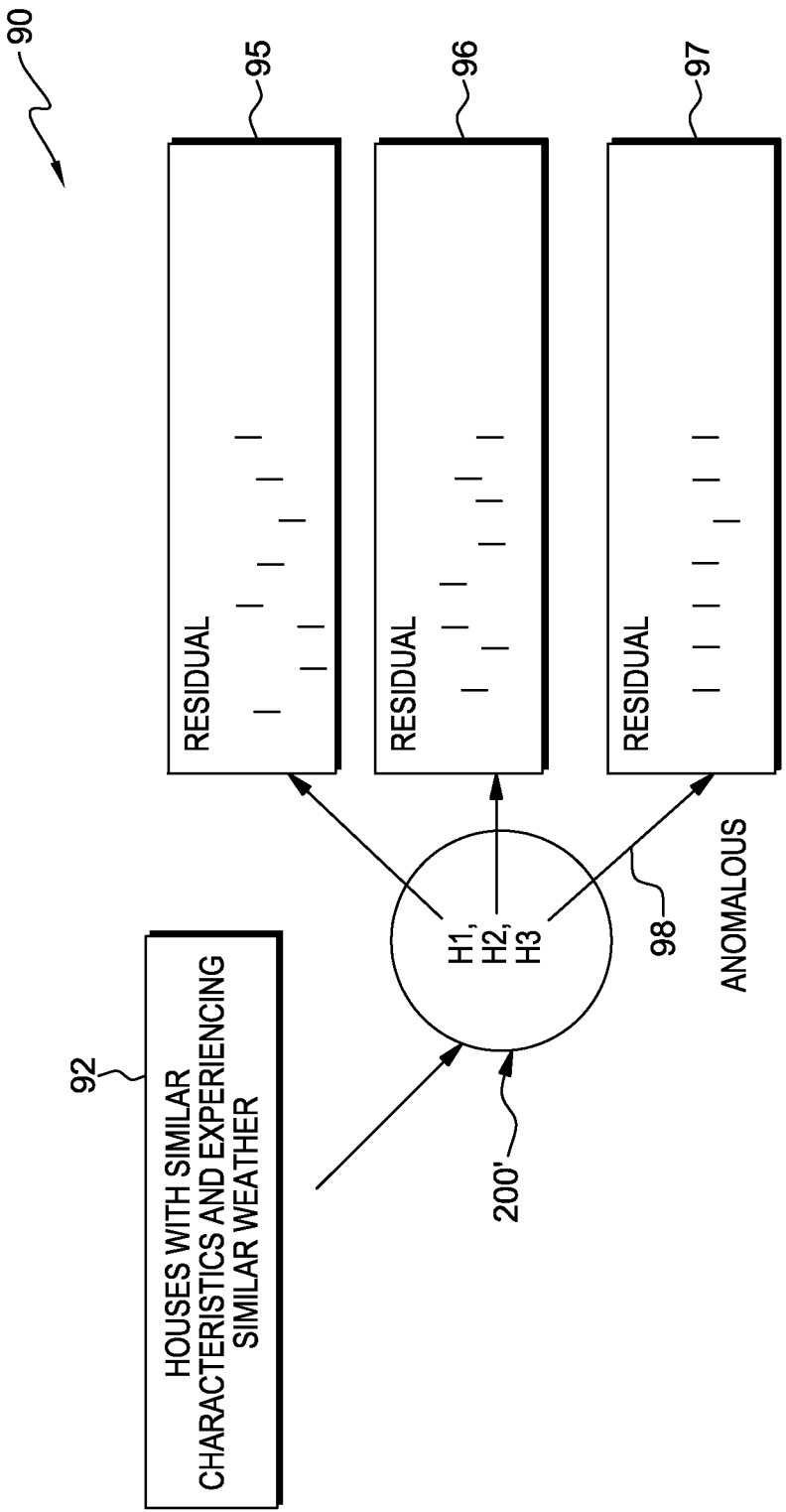
FIG. 9 demonstrates a concept for determining if daily usage is randomized using a non-linear regression model that learns usage patterns over weather conditions and building characteristics and can determine residual patterns.

FIG. 9 demonstrates the concept for determining if daily usage is randomized. For example, FIG. 9 depicts the households where for each shift 90, a non-linear regression model is built 200' that learns usage patterns over weather conditions and building characteristics and can determine residual patterns. As indicated at 92, models are generated that result in residual patterns 95, 96, 97 generated for respective households H1, H2 and H3 having similar characteristics and experiencing similar weather. In one embodiment, under normal conditions, after factoring out the weather and building characteristics by subtracting the actual usage from the expected usage obtained from the non-linear regression model, the residuals 95, 96, 97 of the non-linear regression models in the second analytic kernel described herein above should be random. If a pattern exists, then this is possibly a consequence of intelligent behavior on the part of the homeowner, and would indicate anomalous activity (e.g., household owner trying to adjust their usage to make it 'look' reasonable to avoid detection but yet below what it actually is to reduce their bill).

Figure 10:
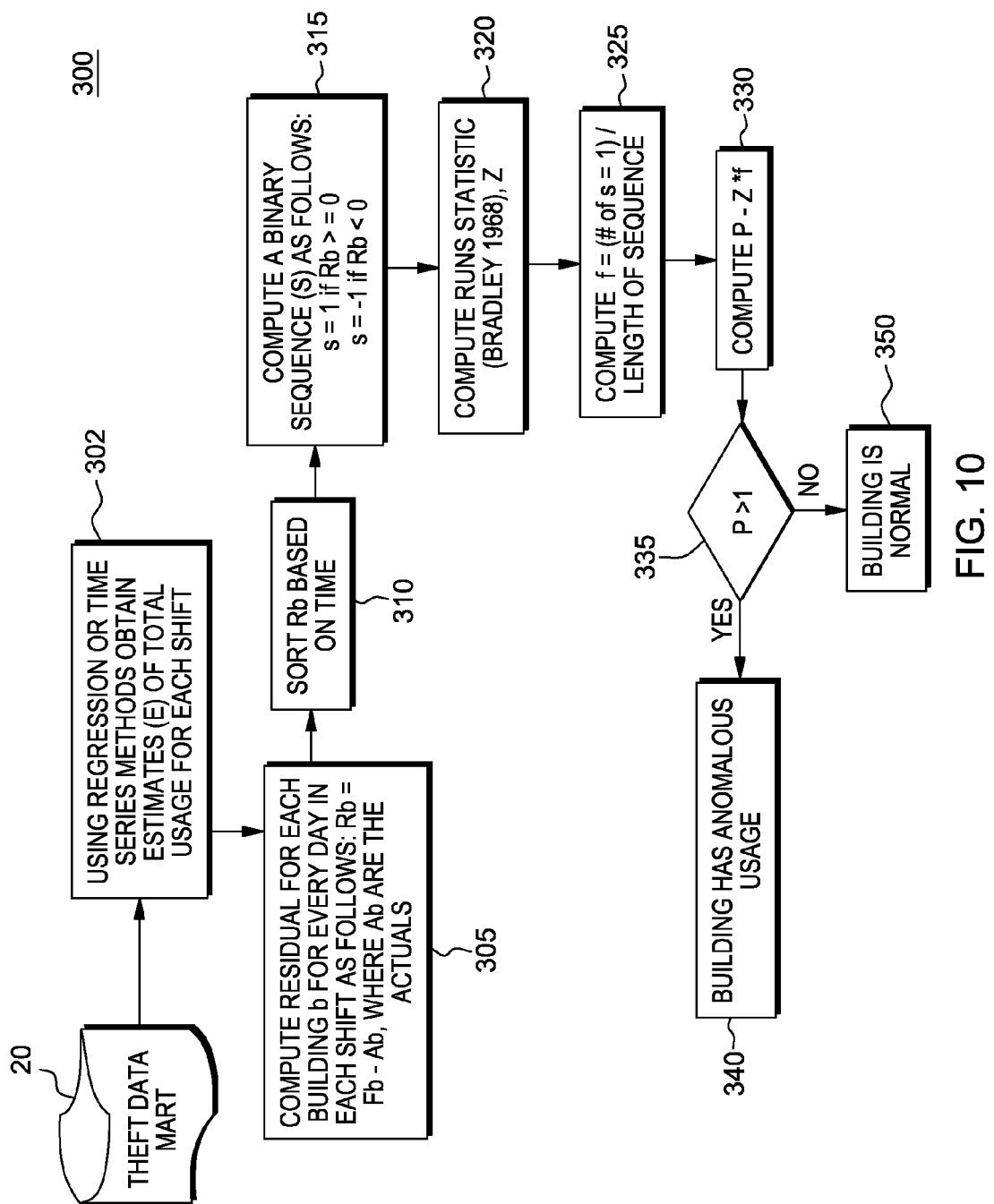
FIG. 10 shows a general method of detecting residual patterns by first modeling an entity's energy usage with non-linear regressions.

FIG. 10 shows a general method 300 of detecting residual patterns by first modeling an entity's energy usage with non-linear regressions. From the theft data mart 20, data processing techniques are invoked at 302 that perform regression or time series methods, such as by using Autoregressive Integrated Moving Average (ARIMA) exponential smoothing techniques, to obtain estimates (E) of total usage for each shift, e.g., three shifts. The process continues at 305 to perform computing a residual for each building, Rb, for every day in each shift as follows:

$Rb=Fb-Ab$ where Fb is the predicted usage and Ab are the actual energy usage. Then, at 310, the computed Rb values (for each building) are sorted based on a time order. Then, continuing to 315, there is performed computing a binary sequence(s) as follows:

$s=1$ if $Rb \geq 0$ $s=-1$ if $Rb<0$.

In one aspect, the data is continuous (e.g., a sequence of real numbers, e.g., 0.5, 1.2, 2.4, . . . as a consequence of which Rb is continuous. The described conditions transform Rb which is a continuous sequence into an appropriate discrete one before the adapted test is applied.

Then, continuing to 320, there is performed computing a runs statistic having a value "Z". In particular, 'Z' is a "runs" statistic which is computed over a binary sequence, e.g., 1-1111-1. In this embodiment, there is implemented a customized statistic 'P' to detect patterns in the residuals. 'P' is computed from 'Z' multiplied by 'f' for the problem since only negative values of Rb (residual) are of interest.

First, as shown at 325, there is computed a value "f" governed by $$f=(\# \text{ of } s=1)/(\text{Length of Sequence}).$$

Then, at 330, there is computed a "P" value governed by:

$$P=Z*f$$

Continuing to 335, a determination is made as to whether the computed value P>1. For example, if it is detected based on computed residuals that P>1, then this is indication that there exists a pattern and the corresponding building has anomalous usage as indicated at 340. This statistic is implemented in SPSS Modeler such as via Modeler's component framework extension API. Otherwise, if P≤1 then, the building is deemed to exhibit normal usage (no residuals pattern detected). The statistic P, used in this "runs" test for detecting non-randomness, the threshold of value '1' to decide randomness or not, and the application of this technique as applied to continuous data is distinguishable from the prior art Bradley, 1968.

Thus, returning to the example scenario of FIG. 9 demonstrating computing the example residuals 95, 96, 97, there will be identified household 97 whose usage results in computed residuals exhibiting a pattern. The last household (H3) is then flagged at 98 as anomalous because the pattern of its residuals 97 fail a randomness test indicating that someone is trying to 'game' their usage to make it look 'reasonable' but yet lower than it actually is.

FIG. 11A depicts example usage plots of residuals (y-axis) over time (x-axis) where a first plot 400 depicts usages 401 exhibiting a pattern where a calculation for P yields 7.5>>1 thereby indicating the residual computed for a most anomalous building; and the second plot 410 of FIG. 11B depicts usages 411 that do not exhibit a pattern where a calculation for P yields 0.03<<1 thereby indicating the residual computed for a normal building.

A fourth algorithmic kernel, in one example embodiment, utilizes clustering techniques to improve Predictive Models of Energy Use. This fourth analytic track uses the standard techniques (K-means clustering or two-step) to cluster buildings by characteristics (size, age, etc.) for each shift, and then, exploring shifting household cluster membership by building linear (e.g., it can be non-linear but it may be limited to linear) models of energy usage vs. temperature. The method includes determining, based on the goodness of fit of shift-level models, whether a household is better suited in one cluster vs. another. Thus, this technique builds the "best" (e.g., according to a computed $r^2$ measure of how good a statistical model fits the actual data) predictive model of energy use for houses within a cluster.

Figure 12A:
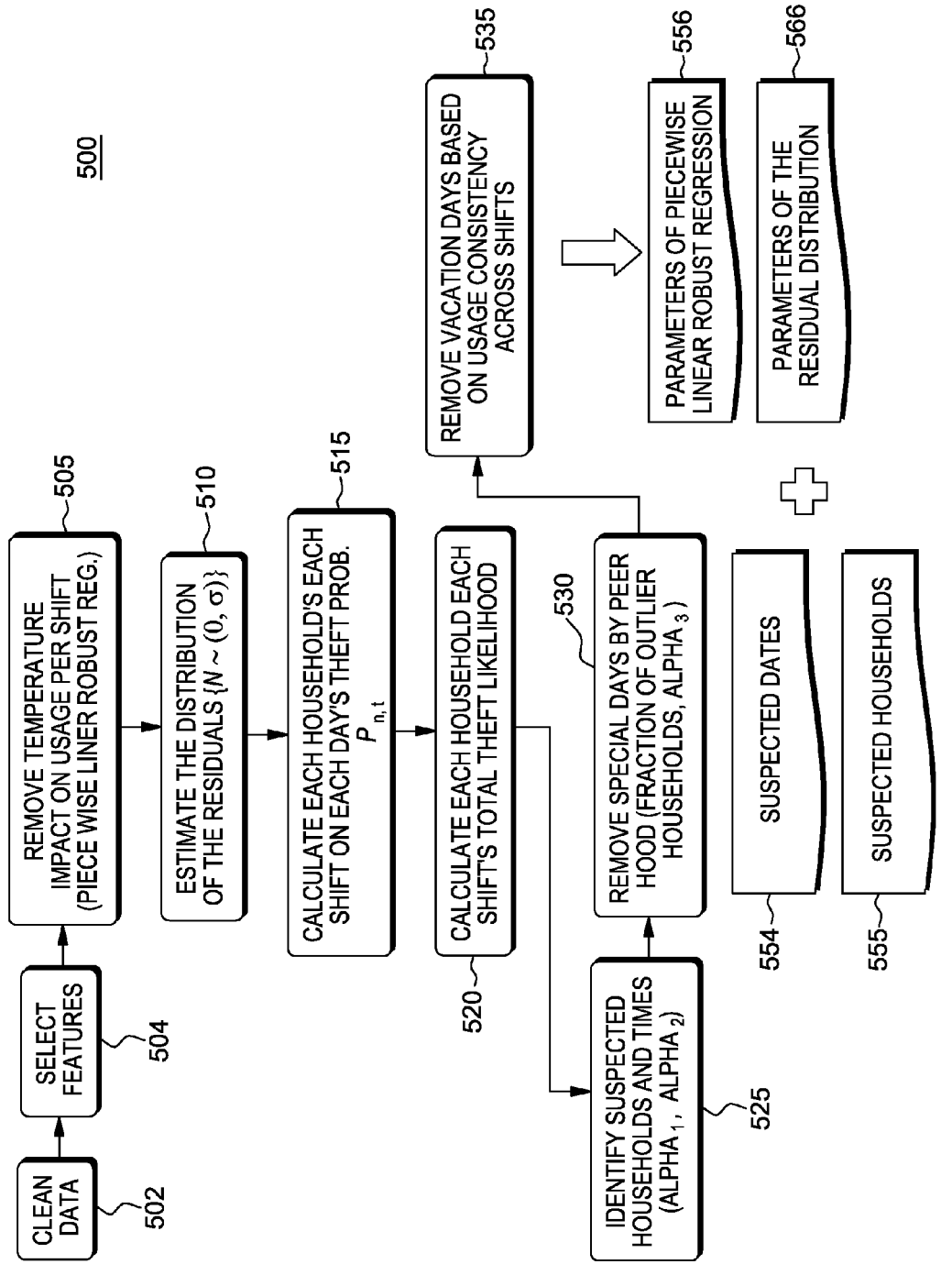
FIG. 12A shows a general method of anomaly usage detection driven by rules and a temperature feature in one embodiment.
Figure 13B:
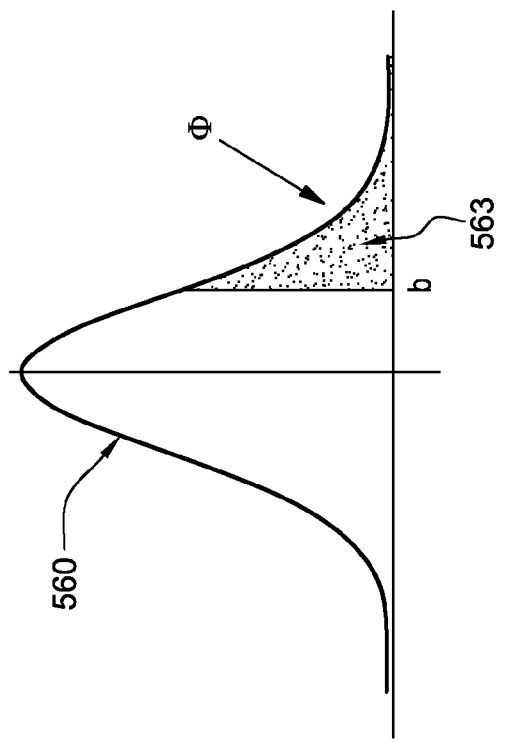
FIG. 13B shows, for a given shift, the residuals from all the households and all of the days being fit to a normal distribution $\Phi(0, \sigma)$ in one embodiment.
Figure 13A:
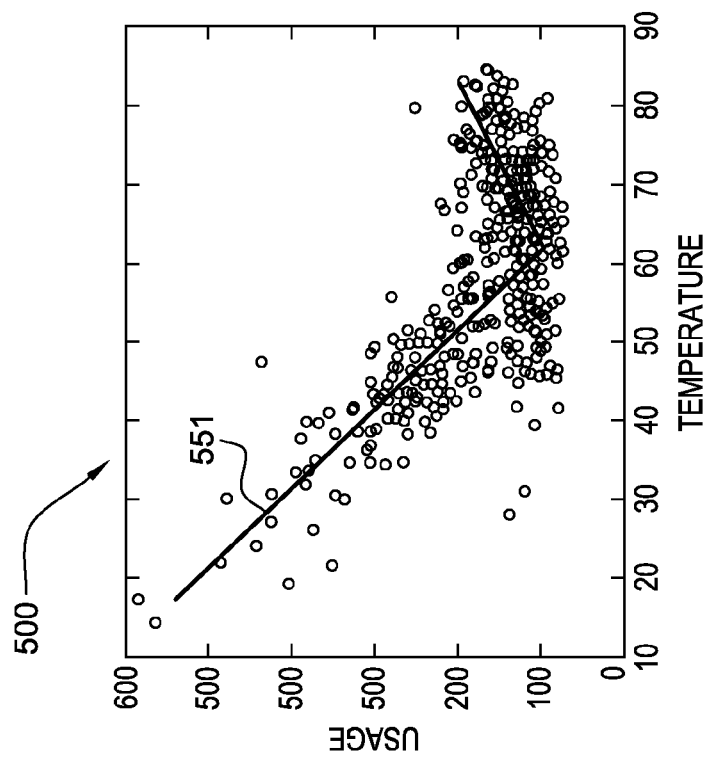
FIG. 13A shows, for a given shift, daily usage plotted on y-axis depicting a dependence on temperature plotted on x-axis shown as a fitted curve.

FIG. 12A shows a general method 500 of anomaly usage detection driven by rules and the usage versus temperature variable data. As daily energy usage can be driven by many features or factors (e.g., temperature, seasonal holidays, building size), then for a household, n, energy usage, Un, is modeled to be a function of various features or factors X, according to:

$$Un=f(X)+Rn,$$

where X is a vector of variables, R is the computed residual of household n as defined above. As shown in the plot 550 of FIG. 13A, for a given shift, daily usage plotted on y-axis shows dependence on temperature plotted on x-axis. Particularly, as shown in FIG. 13A, the plot 550 of usage vs. temperature is depicted as a fitted curve 551, e.g., a "bathtub" shaped curve (as it goes from high to low and then back again or vice-versa). The method invokes a piecewise robust linear regression technique to model the usage pattern of each household. The piecewise robust linear regression removes the usage pattern due to factors, such as temperature, building size. The residuals should be random.

The resulting residuals form a random probability field: {Rn,t}, where t denotes the t-th day. Theoretically, the residual field Rn, t should be independent and identically distributed. In one embodiment, it is assumed they follow a normal distribution N(0, sigma). The random probability field {Rn,t} is used when the theft likelihood of a household or a day is calculated wherein, in one embodiment, the method fixes n and multiplies the probability over all t; or alternatively, the method fixes t and multiplies the probability over all households (n). That is, as shown in FIG. 13B, for a given shift, the residuals from all the households and all of the days are fit to a normal distribution $\Phi(0, \sigma)$ 560, i.e., an estimate $\sigma$. Thus, given a residual value b, the shaded area 563 is the theft probability {Ln,t} of household n on day t.

Thus, after obtaining "clean" usage data ("clean" data being data presented for analysis after all of the various errors have been corrected) at 502, methods are invoked at 504 to select a feature variable of X, e.g., temperature, for regression. Then, at 505, the temperature impact on the usage data per shift is removed considering the curve 551 of FIG. 13A as effected by constructing a piecewise linear robust regression. It should be understood that temperature is used as an example, and that other "features" that prove influential to energy consumption (e.g., hours of direct sunlight) can be used as well. Then at 510, methods are invoked to estimate the distribution of the residuals, e.g., a normal distribution N(0, sigma) as shown resulting in a distribution curve 560 shown in FIG. 13B. In one embodiment, the residual distribution is estimated by fitting the residual to the normal distribution and using a statistical method such as a maximum likelihood computation to estimate the parameters of the normal distribution. Then, as shown in FIG. 12A, the solution outputs the parameters 565 of the piecewise linear robust regression and outputs the parameters 566 of the residual distribution after training. These parameters can be used for predicting the electrical theft in future applications.

Then, at 515 methods are invoked to calculate, for each household, at each shift, each day's theft probability likelihood ($P_{n,t}$) where $P_{n,t}=\Phi^{-1}$ (residual usage), where $\Phi^{-1}$ represents the inverse function of the normal distribution 560 shown in FIG. 13B. For a household n, $Pn,.=Pn,1*Pn,2* \ldots Pn,t$; on day t, $P.,t=P1,t*P2,t* \ldots Pn,t$.

Thus, given the cleansed sample data, there is estimated the sigma and calculated theft likelihood field of each household and each day, {Ln,t} at 520, FIG. 12A. This process is repeated to obtain the likelihood field for all the three shifts. Then, at 525, processes are performed to identify the suspected households and times based on rules (e.g., thresholds $\alpha\_1$, $\alpha\_2$) in terms of the theft likelihood field. In this manner, the solution will output suspected dates 554 and suspected households 555.

For example, if the total theft likelihood, i.e., the product of the likelihood from all the shifts, e.g., 3 shifts, per a household per day is greater or equal than $\alpha\_1$, it is identified as a suspected household; if the total theft likelihood of a day is greater or equal than $\alpha\_2$, the day is deemed as a suspected time; for the suspected household and day, if for example, the theft probability of shift 3 is higher than that of the others, the day is not deemed as a holiday or vacation time. Note: $\alpha\_1$ and $\alpha\_2$ are calculated across all the households and all the days, respectively. The rules are learned from both date and domain knowledge, and can be many.

An example application of a rule is shown with respect to FIG. 12 B which shows a 3-Dimensional plot 575 of households, vs. days and shift, depicted for use in determining a suspected household and time. In the 3D graph plot example 575, if the theft likelihood of a shift is significantly inconsistent to that of the other shifts in a day, and that of the other households, and its historical behavior, then this household and the corresponding day is labeled as "suspicious", e.g., as shown as suspicious point 580 representing a suspicious day and household with a computed large probability of theft based on the comparison of the residual usage to a given threshold. Such rules not only can identify suspicious household and times but also reduce false alarms, e.g., due to low usage during vacation days.

In one embodiment, this analytic can autonomously identify vacation and other key calendar events (e.g., school breaks when families tend to go on vacation) that suppress electricity usage and factor this in at step 530 before making the assertion that a low usage in a time period is suspicious. That is, at 530, methods are invoked to remove special days by peer hood (fractions of outlier households, $\alpha\_3$) where $\alpha\_3$ is a threshold given by experiences and domain knowledge, or learned from usage and theft history. In one embodiment, for households, for any day or all the days, if the determined usage is over threshold $\alpha\_3$, then that fraction of household are outliers on a particular day, and this day is identified as holiday or vacation period. Then, at 535, methods are invoked to remove vacation days based on usage consistency across shifts. An example of inconsistent shift usage is when, for a given household on a given day, the usage of one shift is identified as outlier and the usages in other shifts are not. For example, given a day, the method calculates the fraction of households with theft probability larger than $\alpha\_2$; if the fraction is larger than $\alpha\_3$ threshold, that means the usage of most households are consistently low and deemed as a "holiday".

Figure 12B:
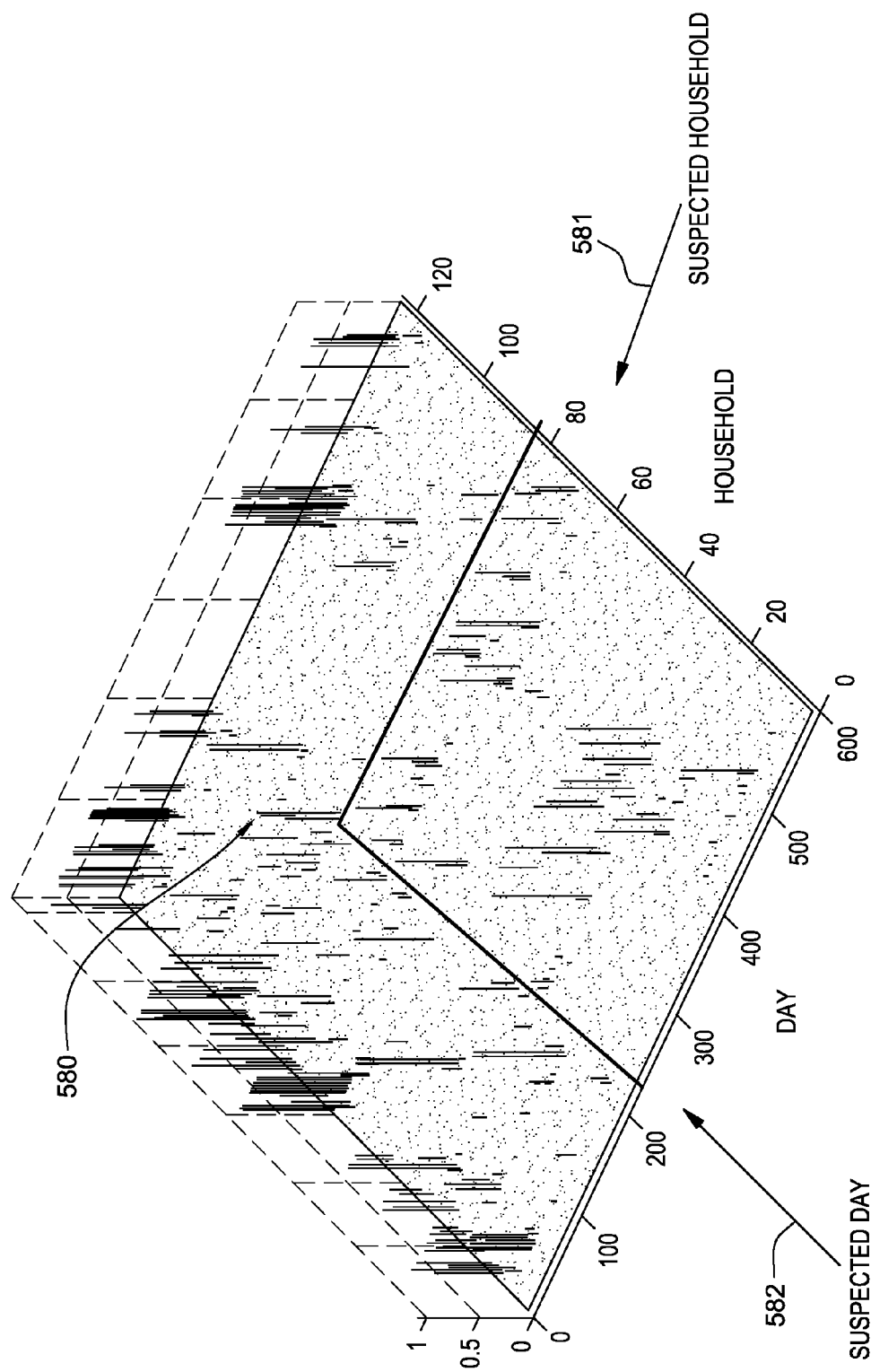
FIG. 12B shows the determination of a suspected household and day according to a further analytics track.

Then, as shown in FIG. 12B, a suspected point 580 is determined for a given shift: the theft probability form a probability field: day by household. The process steps of FIG. 12A are repeated to obtain the likelihood field for all the three shifts. Then there is automatically detected suspected household 581 and time (e.g., day) 582 based on rules in terms of theft likelihood field. For example, if the theft likelihood of a shift is significantly inconsistent to that of the other shifts in a day, that of the other households, and its historical behavior, the household and the corresponding day is labeled as "suspicious".

Thus, a random probability field and usage consistency based theft detection is devised. The systems and methods described herein enable an electric utility to: automate the task of identifying households suspected of theft via meter tampering; identify during which times of day a particular household typically engages in meter tampering; prioritize costly theft investigative resources according the a rank-ordered list of likely fraudulent households; and reduce non-technical losses due to electricity theft.

In one embodiment, each of the four kernel algorithms described produces the same output—a list of household identifiers ordered (except for the third analytic track) by the degree to which their usage deviates from expected. For the first analytic track, the rank ordering is based on the number of shift migrations observed. For the second analytic track, it's based on the number of times that energy usage falls below predicted (based on the best fitting model) levels. For the third analytic track, there is no explicit sorting since a household is placed in a set of suspicious ones if at any time non-randomness is detected in the residual patterns. For the fourth analytic track, it is the theft likelihood (based on probability of having residual energy use be a certain distance from an expected residual mean) of each household on each day.

FIG. 14 illustrates an exemplary hardware configuration of a computing system 700 running and/or implementing the methods described herein. The hardware configuration preferably has at least one processor or central processing unit (CPU) 711. The CPUs 711 are interconnected via a system bus 712 to a random access memory (RAM) 714, read-only memory (ROM) 716, input/output (I/O) adapter 718 (for connecting peripheral devices such as disk units 721 and tape drives 740 to the bus 712), user interface adapter 722 (for connecting a keyboard 724, mouse 726, speaker 728, microphone 732, and/or other user interface device to the bus 712), a communication adapter 734 for connecting the system 700 to a data processing network, the Internet, an Intranet, a local area network (LAN), etc., and a display adapter 736 for connecting the bus 712 to a display device 738 and/or printer 739 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with a system, apparatus, or device running an instruction. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

What is claimed is:

1. A computer-implemented method for detecting anomalous energy usage amongst building and household entities, said method comprising:
receiving, at a computing system, data comprising energy usage data relating to a building's actual energy use over a defined time period (shift), characteristics data of the building, and weather data over one or more defined time periods, said building characteristics data comprising one or more selected from the group consisting of: a physical size of the building, a number of floors, a number of occupants, building age, a number of bedrooms, a number of bathrooms, a type of heating fuel in use, a type of air conditioning in use, and a latitude and longitude coordinate of the building;
clustering buildings in one or more clusters as determined based on a building's energy usage in each time period;
identifying buildings having energy usage that migrate from one cluster to another cluster across time of day shifts, said identifying comprising:
representing a series of data processing operations as a series of data processing nodes, a node representing a usage data source for obtaining said energy usage data for a building;
performing, from said node, concurrent data processing operations as parallel paths according to a respective shift, each parallel path comprising a flow of operations comprising a linking of said node, a node representing a data aggregation operation for that shift and a node representing clustering operations for that shift;
merging data operations at each parallel path to obtain a list of energy use migrations for that building;
generating a model to predict a building's energy usage, said model defining expected bounds of energy consumption given a time period (shift) and said weather data and building characteristics data received;

comparing energy usage for each building against an energy use predicted by the model for said building; and identifying, from said comparison, buildings whose electricity usage is not predicted by the model, said identifying comprising:

performing, from said node representing a usage data source for a building, concurrent data processing operations as parallel paths according to a respective shift, each parallel path comprising a flow of operations comprising a linking of said node, a node for generating non-linear regression models of energy use data aggregation operation for that shift, a node of operations for detecting anomalous buildings for that shift, and a node of operations to rank a building's anomalous energy usage based on statistics computed for the number of times a household's usage is flagged as anomalous; and merging data operations at each parallel path to obtain a list of top buildings having anomalous energy usage;

wherein said buildings identified as migrating from one cluster to another cluster between time periods, and said buildings exhibiting electricity usage not predicted by said generated model are flagged as anomalous energy usage entities, and wherein a processing unit of said computer system is configured to perform said receiving, clustering, identifying of migrating buildings, model generating, comparing, and said identifying of buildings from said comparison.

2. The method of claim 1, wherein said clustering buildings comprises:

for each time period, assigning a building to one of N clusters of buildings determined based on their energy usage;

said clusters including: low usage buildings, medium usage buildings, and high usage buildings.

3. The method of claim 1, wherein said generated model comprises a non-linear regression model of energy usage for a building and weather type, said energy use comparing comprising:

factoring out variations due to building characteristics and weather conditions from said generated model, wherein said identified building exhibits an anomalous energy usage given one or more of a weather condition and building characteristic.

4. The method of claim 1, wherein said method further comprises:

sorting the flagged buildings based on a metric for ranking buildings based on a number of times a building's actual energy usage falls below the model-defined lower bounds factoring in said weather condition and building characteristic.

5. The method of claim 3, further comprising:

obtaining, from said generated non-linear regression model, a pattern of the residuals of the generated model over time, a residual representing a difference between the energy actual and predicted energy use for a building; and analyzing residual effects of a building's energy usage after said factoring out building characteristics and weather conditions using a randomization test, said randomization test determining, for each building or household, whether its obtained pattern of residuals is random or demonstrates non-randomness, wherein said buildings identified as demonstrating non-randomness of its obtained pattern of residuals are flagged as anomalous energy usage entities.

6. The method of claim 5, wherein said randomization test detects non-randomness, said test comprising:

obtaining a first statistic value "Z" computed over pattern comprising a binary sequence "s" of computed residual values;

computing a second statistic value 'P' to detect patterns in the residuals, said 'P' governed according to:

$$P = Z^* f$$

wherein a value "f" is a function of the number of residual values of said binary sequence "s" computed as equal to 1, divided by a length of said binary sequence.

7. The method of claim 6, further comprising:

determining whether said computed value P>1 indicating a residuals pattern, and flagging said corresponding building as exhibiting anomalous energy usage.

8. The method of claim 3, further comprising:

clustering buildings according to said building characteristics, for each shift, based on energy usage;

building linear or non-linear models of energy usage versus temperature; and determining, based on a goodness of fit of shift-level models, whether a household is better suited in one cluster over another cluster.

9. The method of claim 8, wherein said building of linear or non-linear models comprises:

invoking a piecewise robust linear regression technique that models a usage pattern of each building, wherein resulting residuals form a random probability field: $\{R_{n,t}\}$, where t denotes the t-th day, n is the building entity;

estimating a sigma and theft likelihood field $\{L_{n,t}\}$ of each building and each day, and obtaining the likelihood field for all the shifts; and, identifying said buildings and corresponding defined time periods as anomalous energy usage entities based on rules applied to the theft likelihood field.

10. The method of claim 9, wherein said building of linear or non-linear models comprises:

wherein said identifying buildings as anomalous energy usage entities based on a rule comprises:

determining if a theft likelihood of a shift for a building is inconsistent to a theft likelihood determined for other shifts in a day, and is inconsistent to a theft likelihood determined for other buildings.

11. A computer-implemented method for detecting anomalous energy usage amongst building and household entities, said method comprising:

receiving, at a computing system, data comprising energy usage data relating to a building's actual energy use over a defined time period (shift), characteristics data of the building, and weather data over one or more defined time periods, said building characteristics data comprising one or more selected from the group consisting of: a physical size of the building, a number of floors, a number of occupants, building age, a number of bedrooms, a number of bathrooms, a type of heating fuel in use, a type of air conditioning in use, and a latitude and longitude coordinate of the building;

running a first anomaly energy use detection scheme to cluster buildings in one or more clusters as determined based on a building's energy usage in each time period and identify buildings having energy usage that migrate from one cluster to another cluster across time of day shifts, said running a first anomaly energy use detection scheme comprising:

representing a series of data processing operations as a series of data processing nodes, a node representing a usage data source for obtaining said energy usage data for a building;

performing, from said node, concurrent data processing operations as parallel paths according to a respective shift, each parallel path comprising a flow of operations comprising a linking of said node, a node representing a data aggregation operation for that shift and a node representing clustering operations for that shift;

merging data operations at each parallel path to obtain a list of energy use migrations for that building;

running a second anomaly energy use detection scheme to generate a non-linear regression model to predict a building's energy usage, said model defining expected bounds of energy consumption given a time period (shift) and weather and building characteristics data received, and identifying buildings whose electricity usage is not predicted by said model, said identifying comprising:

performing, from said node representing a usage data source for a building, concurrent data processing operations as parallel paths according to a respective shift, each parallel path comprising a flow of operations comprising a linking of said node, a node for generating said non-linear regression model to predict energy use data aggregation operation for that shift, a node of operations for detecting anomalous buildings for that shift, and a node of operations to rank a building's anomalous energy usage based on statistics computed for the number of times a household's usage is flagged as anomalous; and merging data operations at each parallel path to obtain a list of top buildings having anomalous energy usage; and running a third anomaly energy use detection scheme to obtain from said generated non-linear regression model, a pattern of residuals of the generated model over time, a residual representing a difference between the energy actual and predicted energy use for a building, and identifying buildings demonstrating non-randomness of its obtained pattern of residuals; and running a fourth anomaly energy use detection scheme to estimate a sigma and theft likelihood field $\{L_{n,t}\}$ of each building and each day, and obtaining a theft likelihood field for all the shifts; and, invoke a rule applied to said theft likelihood field; and flagging anomalous energy usage buildings as buildings identified as: having energy usage that migrate from one cluster to another cluster between time periods; having electricity usage not predicted by said model; exhibiting demonstrating non-randomness of its obtained pattern of residuals; or have a residual energy computed for a building as exceeding a certain distance from an expected residual mean based on said rule; or combinations thereof.

12. The computer-implemented method of claim 11, wherein running said second anomaly energy use detection scheme comprises:

generating a model to predict a building's energy usage, said model defining expected bounds of energy consumption given time of day (shift) and weather and building characteristics data received;

comparing energy usage for each building against an energy use predicted by the model for said building; and identifying, from said comparison, buildings whose electricity usage is not predicted by model, wherein said generated model comprises a non-linear regression model of energy usage for a building and weather type, said energy use comparing comprising:

factoring out variations due to building characteristics and weather conditions from said generated model.

13. The computer-implemented method of claim 11, wherein running said third anomaly energy use detection scheme comprises:

factoring out variations due to building characteristics and weather conditions from said generated model, analyzing residual effects of a building's energy usage after said factoring out building characteristics and weather conditions using a randomization test, said randomization test determining, for each building or household, whether its obtained pattern of residuals is random or demonstrates non-randomness, wherein said randomization test comprises:

obtaining a first statistic value "Z" computed over pattern comprising a binary sequence "s" of computed residual values;

computing a second statistic value 'P' to detect patterns in the residuals, said 'P' governed according to:

$$P=Z*f$$

wherein a value "f" is a function of the number of residual values of said binary sequence "s" computed as equal to 1, divided by a length of said binary sequence, and wherein a computed value P>1 indicates a residuals pattern resulting in said corresponding building being flagged as exhibiting anomalous energy usage.

* * * * *